US010804680B2

(12) United States Patent
Zediker et al.

(10) Patent No.: US 10,804,680 B2
(45) Date of Patent: Oct. 13, 2020

(54) VERY DENSE WAVELENGTH BEAM COMBINED LASER SYSTEM

(71) Applicant: Nuburu, Inc., Centennial, CO (US)

(72) Inventors: Mark S. Zediker, Castle Rock, CO (US); Robert Stegeman, Denver, CO (US)

(73) Assignee: Nuburu, Inc., Centennial, CO (US)

( * ) Notice: Subject to any disclaimer, the term of this patent is extended or adjusted under 35 U.S.C. 154(b) by 0 days.

(21) Appl. No.: 16/006,883

(22) Filed: Jun. 13, 2018

(65) Prior Publication Data

US 2018/0375296 A1 Dec. 27, 2018

Related U.S. Application Data

(60) Provisional application No. 62/519,113, filed on Jun. 13, 2017.

(51) Int. Cl.
| | |
|---|---|
| *H01S 3/08* | (2006.01) |
| *H01S 5/40* | (2006.01) |
| *H01S 5/00* | (2006.01) |
| *H01S 5/14* | (2006.01) |
| *H01S 5/028* | (2006.01) |
| *H01S 5/022* | (2006.01) |

(52) U.S. Cl.
CPC .......... *H01S 5/4012* (2013.01); *H01S 5/0078* (2013.01); *H01S 5/14* (2013.01); *H01S 5/4062* (2013.01); *H01S 5/4068* (2013.01); *H01S 5/4075* (2013.01); *H01S 5/4087* (2013.01); *H01S 3/08059* (2013.01); *H01S 5/0287* (2013.01); *H01S 5/02284* (2013.01); *H01S 5/141* (2013.01); *H01S 5/405* (2013.01); *H01S 5/4093* (2013.01)

(58) Field of Classification Search
CPC .... H01S 5/4012; H01S 5/0078; H01S 5/4062; H01S 5/4068; H01S 5/4075; H01S 5/4087; H01S 5/02284; H01S 5/0287; H01S 5/141; H01S 5/405; H01S 5/14; H01S 5/4093
See application file for complete search history.

(56) References Cited

U.S. PATENT DOCUMENTS

| | | | |
|---|---|---|---|
| 4,288,678 | A | 9/1981 | LaRocca |
| 4,679,198 | A | 7/1987 | Shone |
| 4,847,479 | A | 7/1989 | Clark |

(Continued)

FOREIGN PATENT DOCUMENTS

| | | |
|---|---|---|
| CN | 104742376 | 7/2015 |
| CN | 2017/030145 | 7/2017 |

(Continued)

*Primary Examiner* — Kinam Park
(74) *Attorney, Agent, or Firm* — Glen P. Belvis; Belvis Law, LLC.

(57) ABSTRACT

Apparatus, systems and methods to spectrally beam combine a group of diode lasers in an external cavity arrangement. A dichroic beam combiner or volume Bragg grating beam combiner is placed in an external cavity to force each of the diode lasers or groups of diode lasers to oscillate at a wavelength determined by the passband of the beam combiner. In embodiments the combination of a large number of laser diodes in a sufficiently narrow bandwidth to produce a high brightness laser source that has many applications including as to pump a Raman laser or Raman amplifier.

71 Claims, 14 Drawing Sheets

(56) References Cited

U.S. PATENT DOCUMENTS

| | | |
|---|---|---|
| 4,857,699 A | 8/1989 | Duley |
| 4,879,449 A | 11/1989 | Duley |
| 4,930,855 A | 6/1990 | Clark |
| 4,960,973 A | 10/1990 | Fouch |
| 4,973,819 A | 11/1990 | Thatcher |
| 5,127,019 A | 6/1992 | Epstein |
| 5,379,310 A | 1/1995 | Papen |
| 5,392,308 A | 2/1995 | Welch |
| 5,502,292 A | 3/1996 | Pernicka |
| 5,526,155 A | 6/1996 | Knox |
| 5,578,227 A | 11/1996 | Rabinovich |
| 5,808,803 A | 9/1998 | Uliman |
| 5,903,583 A | 5/1999 | Uliman |
| 5,923,475 A | 7/1999 | Kurtz |
| 5,986,794 A | 11/1999 | Krause |
| 5,987,043 A | 11/1999 | Brown |
| 6,115,401 A * | 9/2000 | Scobey ............... H01S 3/08036 372/100 |
| 6,124,973 A | 9/2000 | Du |
| 6,129,884 A | 10/2000 | Beers |
| 6,151,168 A | 11/2000 | Goering |
| 6,175,452 B1 | 1/2001 | Uilmann |
| 6,191,383 B1 | 2/2001 | Jense |
| 6,212,310 B1 | 4/2001 | Waarts |
| 6,251,328 B1 | 6/2001 | Beyer |
| 6,331,692 B1 | 10/2001 | Krausse |
| 6,327,292 B1 | 12/2001 | Sanchez-Fubio |
| 6,575,863 B2 | 6/2003 | Piltch |
| 6,584,133 B1 | 6/2003 | Walker |
| 6,591,040 B1 | 7/2003 | Dempewolf |
| 7,001,467 B2 | 2/2006 | Pique |
| 7,006,549 B2 | 2/2006 | Anikitchev |
| 7,034,992 B2 | 4/2006 | Komine |
| 7,233,442 B1 | 6/2007 | Brown |
| 7,570,856 B1 | 8/2009 | Minelly |
| 7,765,022 B2 | 7/2010 | Mazumder |
| 7,959,353 B2 | 6/2011 | Anatharaman |
| 8,130,807 B2 | 3/2012 | Schulz-Harder |
| 8,488,245 B1 | 7/2013 | Chann |
| 8,520,311 B2 | 8/2013 | Krause |
| 8,553,327 B2 | 10/2013 | Chann |
| 8,559,107 B2 | 10/2013 | Chann |
| 8,670,180 B2 | 3/2014 | Chann |
| 8,724,222 B2 | 5/2014 | Chann |
| 9,093,822 B1 | 7/2015 | Chann |
| 9,172,208 B1 | 10/2015 | Dawson |
| 9,104,029 B2 | 11/2015 | Tayebati |
| 9,178,333 B2 | 11/2015 | Tayebati |
| 9,190,807 B2 | 11/2015 | Tayebati |
| 9,203,209 B2 | 12/2015 | Ramachandran |
| 9,256,073 B2 | 2/2016 | Chann |
| 9,268,097 B2 | 2/2016 | Huang |
| 9,268,142 B2 | 2/2016 | Chann |
| 9,306,369 B2 * | 4/2016 | Huber ................ H01S 5/141 |
| 9,310,560 B2 | 4/2016 | Chann |
| 2001/0023921 A1 | 9/2001 | Mano |
| 2002/0149137 A1 | 10/2002 | Jang |
| 2003/0048819 A1 | 3/2003 | Nagano |
| 2003/0052105 A1 | 3/2003 | Nagano |
| 2003/0063631 A1 | 4/2003 | Corcoran |
| 2003/0142393 A1 | 7/2003 | Kuksenkov |
| 2004/0056006 A1 | 3/2004 | Jones |
| 2004/0086004 A1 | 5/2004 | Bonaccini |
| 2004/0156401 A1 | 8/2004 | Sandrock |
| 2004/0173587 A1 | 9/2004 | Musselrnan |
| 2004/0036242 A1 | 12/2004 | Orozco |
| 2004/0254474 A1 | 12/2004 | Seibel |
| 2005/0173385 A1 | 8/2005 | Smart |
| 2006/0160332 A1 | 7/2006 | Gu et al. |
| 2007/0002925 A1 * | 1/2007 | Zediker ................ H01S 5/4025 372/98 |
| 2007/0041083 A1 | 2/2007 | Di Teodoro |
| 2008/0085368 A1 | 4/2008 | Abe |
| 2009/0051935 A1 | 2/2009 | Cooper |
| 2009/0190218 A1 | 7/2009 | Govorkov |
| 2009/0225793 A1 | 9/2009 | Marciante |
| 2010/0110556 A1 * | 5/2010 | Chann ................ H01S 5/4062 359/619 |
| 2010/0290106 A1 | 11/2010 | Digiovanni |
| 2011/0122482 A1 | 5/2011 | Mead |
| 2011/0129615 A1 | 6/2011 | Renn |
| 2011/0205349 A1 | 8/2011 | Li |
| 2011/0216792 A1 | 9/2011 | Chann |
| 2011/0267671 A1 | 11/2011 | Peng |
| 2011/0311389 A1 | 12/2011 | Ryan |
| 2012/0012570 A1 | 1/2012 | Briand |
| 2012/0285936 A1 | 11/2012 | Urashirna |
| 2013/0071738 A1 | 3/2013 | Wang |
| 2013/0148673 A1 | 6/2013 | Creeden |
| 2013/0162952 A1 | 6/2013 | Lippey et al. |
| 2013/0269748 A1 | 10/2013 | Wiedeman et al. |
| 2014/0023098 A1 | 1/2014 | Clarkson |
| 2014/0086539 A1 | 3/2014 | Sorraa |
| 2014/0112357 A1 | 4/2014 | Abedin |
| 2014/0249495 A1 | 9/2014 | Mumby et al. |
| 2014/0252687 A1 | 9/2014 | El-Dasher |
| 2015/0033343 A1 | 1/2015 | Jiang |
| 2015/0165556 A1 | 6/2015 | Gordon |
| 2015/0333473 A1 | 11/2015 | Gapontsev |
| 2016/0067780 A1 | 3/2016 | Zediker |
| 2016/0067827 A1 | 3/2016 | Zediker |
| 2016/0322777 A1 * | 11/2016 | Zediker ................ H01S 5/4012 |
| 2017/0021454 A1 | 1/2017 | Joseph |
| 2017/0021455 A1 | 1/2017 | Dallarosa |
| 2017/7021454 | 1/2017 | Dallarosa |
| 2017/0341144 A1 | 11/2017 | Pelaprat et al. |
| 2017/0341180 A1 | 11/2017 | Zediker et al. |
| 2017/0343729 A1 | 11/2017 | Zediker et al. |
| 2018/0236605 A1 | 8/2018 | Finuf et al. |
| 2018/0375296 A1 | 12/2018 | Zediker et al. |
| 2019/0025502 A1 | 1/2019 | Zediker et al. |
| 2019/0089983 A1 | 3/2019 | Choe et al. |
| 2019/0361171 A1 | 11/2019 | Lee |

FOREIGN PATENT DOCUMENTS

| | | |
|---|---|---|
| EP | 1437882 | 4/2014 |
| EP | 3307525 | 4/2018 |
| EP | 3307526 | 4/2018 |
| JP | 6225263 | 6/2015 |
| KR | 1020180017080 A | 12/2016 |
| KR | 1020180017081 A | 12/2016 |
| KR | 10-2018-703763 | 8/2019 |
| WO | WO 2015134075 | 9/2014 |
| WO | WO 2014/179345 | 11/2014 |
| WO | WO 2016201309 | 12/2016 |
| WO | WO 2016201326 | 12/2016 |

* cited by examiner

VERY DENSE WAVELENGTH BEAM COMBINED LASER SYSTEM

This application claims under 35 U.S.C. § 119(e)(1) the benefit of the filing date of U.S. provisional application Ser. No. 62/519,113 filed Jun. 13, 2017, the entire disclosure of which is incorporated herein by reference.

BACKGROUND OF THE INVENTION

Field of the Invention

The present inventions relate to systems, methods and apparatus for combining laser beams to provide laser beams having the properties useful in performing laser operations such as welding, cutting, surface treating, surface cladding, 3-D printing, and as a pump source for other laser systems.

There is a strong need to process materials that cannot be processed with today's IR lasers because of the high reflectivity of the material in the IR. While blue laser light can be strongly absorbed by materials, which are highly reflective in the IR, they have not found general applicability or utility for commercial laser operations. Currently available blue laser beams and systems are incapable of providing blue laser beams that are of equal quality to IR laser beams, e.g., power, brightness, etc. It is believed that prior to the present inventions, blue laser beam systems were, for example, incapable of commercially welding thick materials such as copper, which are highly reflective in the IR. Thus, with the exception of recent advancements by Assignee Nuburu Inc., building a visible wavelength laser of sufficient brightness has evaded the industry for many years, frequency doubling has been attempted with little commercial success due to the limitations of the doubling crystals. Blue laser diodes by themselves are still generally too low power to perform most, a wide range, if not all, commercial laser applications for operations on materials that are highly reflective in the IR. Power levels for these blue diodes are typically very low, with "high power" for these diodes generally referring to about 6 Watt ("W"). Moreover, conventional beam combination methods (spatial, polarization and discrete wavelength) are insufficient to build a blue laser with sufficient brightness to meet the needs of the industry. Spatial combination is limited in brightness by the physical size of the micro-optics used to collimate the laser diode source. Polarization combination (non-coherent) can only increase the brightness by a factor of 2×. Wavelength combination is currently accomplished by coupling a wavelength selective element such as a volume Bragg grating ("VBG") to control the wavelength of the laser diode followed by a series of dichroic filters to combine the beams into a single spatial beam with a wide bandwidth. This approach requires the use of individual VBGs which is an additional cost to the system, as well as increasing the size of the system. Coherent combination, while capable of building high brightness sources, is generally complex and too expensive to implement in a commercial system.

The terms "laser processing, "laser processing of materials," and similar such terms, unless expressly provided otherwise, should be given the broadest possible meaning and would include welding, soldering, smelting, joining, annealing, softening, tackifying, resurfacing, peening, thermally treating, fusing, sealing, and stacking.

As used herein, unless expressly stated otherwise, "UV", "ultra violet", "UV spectrum", and "UV portion of the spectrum" and similar terms, should be given their broadest meaning, and would include light in the wavelengths of from about 10 nm to about 400 nm (nanometer), and from 10 nm to 400 nm.

As used herein, unless expressly stated otherwise, the terms "visible", "visible spectrum", and "visible portion of the spectrum" and similar terms, should be given their broadest meaning, and would include light in the wavelengths of from about 380 nm to about 750 nm, and from 400 nm to 700 nm.

As used herein, unless expressly stated otherwise, the terms "blue laser beams", "blue lasers" and "blue" should be given their broadest meaning, and in general refer to systems that provide laser beams, laser beams, laser sources, e.g., lasers and diodes lasers, that provide, e.g., propagate, a laser beam, or light having a wavelength from about 400 nm to about 500 nm, and from 400 nm to 500 nm.

As used herein, unless expressly stated otherwise, the terms "green laser beams", "green lasers" and "green" should be given their broadest meaning, and in general refer to systems that provide laser beams, laser beams, laser sources, e.g., lasers and diodes lasers, that provide, e.g., propagate, a laser beam, or light having a wavelength from about 500 nm to about 575 nm, and from 500 nm to 575 nm.

As used herein, unless expressly stated otherwise, the terms "red laser beams", "red lasers" and "red" should be given their broadest meaning, and in general refer to systems that provide laser beams, laser beams, laser sources, e.g., lasers and diodes lasers, that provide, e.g., propagate, a laser beam, or light having a wavelength from about 600 nm to about 750 nm, and from 600 nm to 750 nm.

Generally, the term "about" as used herein, unless specified otherwise, is meant to encompass a variance or range of ±10%, the experimental or instrument error associated with obtaining the stated value, and preferably the larger of these.

As used herein, unless expressly stated otherwise, the terms "IR", "infrared", "IR wavelength" and "IR spectrum", should be given their broadest meaning, and in general refer to systems that provide laser beams, laser beams, laser sources, e.g., lasers and diode lasers, that provide, e.g., propagate, a laser beam or light having a wavelength >700 nm, and greater than about 750 nm.

Relevant Art

Spectral beam combination of laser beams in a laser cavity has been known since 1993 (Papen et al, "Multiple-wavelength operation of a laser-diode array coupled to an external cavity, *Optics Letters* 18, 1441 (1993)). However, it is believed that spectral beam combining of high power blue laser diodes with a comb filter element positioned in an external cavity has not been demonstrated or disclosed prior to the present inventions.

The TeraDiode method is illustrative of the challenges of the art. This method is based on the work of Hamilton et. al, and Sanchez et. al, and uses an external cavity arrangement and a grating to combine the outputs of n-laser diodes. The TeraDiode method however requires a very long (~1 m or more) external cavity because of the low dispersion of the grating used to create the comb filter at the face of the laser diode.

Another concept, that has been unsuccessful at high power levels for spectral beam combination of laser diodes to improve the brightness of the laser diode array is a method where the wavelengths of each individual laser diode is locked via a grating structure which is internal to the laser diode itself. The beam combination provides a means to spatially overlap each of the individual laser diode beams outside of any common laser resonator cavity. This method of spectral beam combination is complex, since the spatial beam combination dielectric filter array must match the output wavelength characteristics of each individual laser diode. Additionally, the laser diode structure is much more complex to fabricate due to the necessary inclusion of a feedback structure during the laser diode fabrication process. It is believed that fabricating the grating structure in a visible laser diode has yet to be demonstrated.

This art has numerous failings. Significantly, and among other failings, this art does not teach or disclosed the spectral beam combining of blue, and blue-green, green laser beams and red, or the spectral beam combining of blue, blue-green, green laser diodes and red laser diodes. Additionally, it is believed that to the extent the art may teach or disclose an external cavity, that cavity would be large and prone to thermo-mechanical instabilities. It is further believed that, among other things, the art does not disclose a compact, stable system, and in particular, such a system for the blue, blue-green, green and red wavelengths.

This Background of the Invention section is intended to introduce various aspects of the art, which may be associated with embodiments of the present inventions. Thus, the forgoing discussion in this section provides a framework for better understanding the present inventions, and is not to be viewed as an admission of prior art.

SUMMARY

Embodiments of the present invention overcome these long-standing problems to provide high brightness visible wavelength laser beams, and in particular red, green and blue, and more particularly blue laser beams having high brightness and sufficient power to perform commercial laser operations on materials that are highly reflective in the IR, as well as, improved performance on all other materials. Embodiments of the present inventions accomplish this, as well as, among other things, by greatly simplifying the wavelength beam combination systems and methods While laser diodes are becoming competitive with current fiber lasers, the low brightness of the diode laser beams has been a long-standing problem, and prevents their wider acceptance and utilization. In addition, there has existed a long-standing and unresolved need for compact and small laser systems that can provide high brightness laser beams. The present inventions, among other things, solve these needs by providing the articles of manufacture, devices and processes taught, and disclosed herein.

Thus, there is provided a high power, high brightness laser system which comprises of the following: two or more individual high power laser diodes; a common external cavity shared by two or more individual high power laser diodes; collimating optics for creating parallel beams from each of the high-power laser diodes; a beam combination optics in the common external cavity which determines the wavelength of each laser diode and aligns each laser diode to be co-linear and overlapping in space; the spatial brightness of the laser source is n-times the brightness of a single laser diode where brightness is defined as the combined power divided by the aperture-divergence product.

Further there is provided these high power lasers, systems and methods having one or more of the following features: where the beam combination optic consists of the optical cavity formed from a set of optical filters that are used at the edge of either the low pass or high pass end of the spectrum for a bandpass filter and an output coupler or mirror; operating in the 400-500 nm range with an output power of >1 Watt and a beam parameter product of 0.1 mm-mrad or larger; operating in the 500-600 nm range with an output power of >1 Watt and a beam parameter product of 0.1 mm-mrad or larger; operating in the 720-800 nm range with an output power of >1 Watt and a beam parameter product of 0.1 mm-mrad or larger; operating in the 800-900 nm range with an output power of >1 Watt and a beam parameter product of 0.1 mm-mrad or larger; operating in the 900-1200 nm range with an output power of >1 Watt and a beam parameter product of 0.1 mm-mrad or larger; operating in the 1200 nm-1120 nm range with an output power of >1 Watt and a beam parameter product of 0.1 mm-mrad or larger; operating in the 1400-1500 nm range with an output power of >1 Watt and a beam parameter product of 0.1 mm-mrad or larger; operating in the 1500-2200 nm range with an output power of >1 Watt and a beam parameter product of 0.1 mm-mrad or larger; operating in the 2200-3000 nm range with an output power of >1 Watt and a beam parameter product of 0.1 mm-mrad or larger; operating in the 3000 nm-12000 nm range with an output power of >1 Watt and a beam parameter product of 0.1 mm-mrad or larger.

Yet further there is provided these high power lasers, systems and methods having or providing an output laser beam with a beam parameter product of about 0.1 to about 10 mm-mrad, about 0.5 mm-mrad and larger; about 0.3 mm-mrad and larger, about 1 mm-mrad and larger, about 2 mm-mrad and larger, about 3 mm-mrad and larger, and all values within these ranges, as well as larger and smaller values.

Still further there is provided these high power lasers, systems and methods having one or more of the following features: where the beam combination optic is a set of Volume Bragg Grating filters and one or more volume Bragg gratings that redirects a portion of the optical spectrum from an individual laser diode to be collinear with the previous laser diode in the array and an output coupler which completes the optical cavity; the brightness of the sum of the individual laser diode beams after being directed by the volume Bragg gratings(s) is N times brighter than that of an individual laser diode beam, with N being the number of laser diodes being combined; in a series of N volume Bragg gratings, the points of maximum transmission through volume Bragg grating N coincide with the N–1, N–2, N–3, . . . $1^{st}$ peaks of the lasing spectra of the N–1, N–2, N–3, . . . $1^{st}$ laser diodes, while simultaneously providing maximum beam deflection of laser diode N.

In addition there is provided these high power lasers, systems and methods having one or more of the following features: that operates on the slow axis of the emitted laser diode light and the TE-mode of individual reflection volume Bragg grating(s); that operates on the fast axis of the emitted laser diode light and the TE-mode of individual reflection volume Bragg grating(s); that operates on the slow axis of the emitted laser diode light and the TM-mode of individual reflection volume Bragg grating(s); that operates on the fast axis of the emitted laser diode light and the TM-mode of individual reflection volume Bragg grating(s); that operates on the slow axis of the emitted laser diode light and the TE-mode of individual transmission volume Bragg grating(s); that operates on the fast axis of the emitted laser diode light and the TE-mode of individual transmission volume Bragg grating(s); that operates on the slow axis of the emitted laser diode light and the TM-mode of individual transmission volume Bragg grating(s); that operates on the fast axis of the emitted laser diode light and the TM-mode of individual transmission volume Bragg grating(s); that operates on the slow axis of the emitted laser diode light and the TE-mode of individual reflection volume Bragg grating(s) fabricated in a single piece of material; that operates on the fast axis of the emitted laser diode light and the TE-mode of individual reflection volume Bragg grating(s) fabricated in a single piece of material; that operates on the slow axis of the emitted laser diode light and the TM-mode of individual reflection volume Bragg grating(s) fabricated in a single piece of material; that operates on the fast axis of the emitted laser diode light and the TM-mode of individual reflection volume Bragg grating(s) fabricated in a single piece of material; that operates on the slow axis of the emitted laser diode light and the TE-mode of individual transmission volume Bragg grating(s) fabricated in a single piece of material; that operates on the fast axis of the emitted laser diode light and the TE-mode of individual transmission volume Bragg grating(s) fabricated in a single piece of material; that operates on the slow axis of the emitted laser diode light and the TM-mode of individual transmission volume Bragg grating(s) fabricated in a single piece of material; and that operates on the fast axis of the emitted laser diode light and the TM-mode of individual transmission volume Bragg grating(s) fabricated in a single piece of material.

Still further there is provided a laser source comprising of the following: one or more optical coatings that redirects a portion of the optical spectrum from an individual laser diode at an angle up to 90° with respect to the laser diode output light propagation direction after collimation to a common output coupler; the optical propagation directions in the near-field and far-field are defined by the round trip path in the cavity making them identical among two or more individual laser diodes after being redirected by the optical coating(s); the brightness of the sum of the individual laser diode beams after being directed by the optical coating(s) is N times brighter than that of an individual laser diode beam, with N being the number of laser diodes being combined; in a series of N optical coatings, the points of maximum transmission through optical coating N coincide with the N−1, N−2, N−3, . . . $1^{st}$ peaks of the lasing spectra of the N−1, N−2, N−3, . . . $1^{st}$ laser diodes, while simultaneously providing maximum beam deflection of laser diode N.

Further there is provided these high power lasers, systems and methods having one or more of the following features: that operates on the slow axis of the emitted laser diode light and the TE-mode of individual reflection optical coating(s); that operates on the fast axis of the emitted laser diode light and the TE-mode of individual reflection optical coating (s); that operates on the slow axis of the emitted laser diode light and the TM-mode of individual reflection optical coating(s); that operates on the fast axis of the emitted laser diode light and the TM-mode of individual reflection optical coating(s); that operates on the slow axis of the emitted laser diode light and the TE-mode of individual reflection optical coating(s) fabricated by optical bonding or other low-loss method into a single piece of material; that operates on the fast axis of the emitted laser diode light and the TE-mode of individual reflection optical coating(s) fabricated by optical bonding or other low-loss method into a single piece of material; that operates on the slow axis of the emitted laser diode light and the TM-mode of individual reflection optical coating(s) fabricated by optical bonding or other low-loss method into a single piece of material; and that operates on the fast axis of the emitted laser diode light and the TM-mode of individual reflection optical coating (s) fabricated by optical bonding or other low-loss method into a single piece of material.

Moreover there is provided a laser source comprising of the following: one or more volume Bragg gratings followed by one or more optical; the output light direction from the optical coating(s) is 90° with respect to the output light direction from the volume Bragg grating(s) and an output coupler to complete the optical cavity and define the operating wavelength of each laser diode source; the brightness of the sum of the individual laser diode beams after being combined by the volume Bragg gratings(s),the optical coating(s) and the output coupler is N times brighter than that of an individual laser diode beam, with N is the number of individual laser diode beams, C is the number of optical coating(s), and N/C is the number of individual laser diode beams being combined by the volume Bragg grating(s) as groups; the optical bandwidths of each individual combination of laser diodes combined by the volume Bragg grating(s) are mutually exclusive; given an arbitrary central blue wavelength $\lambda_c$, the optical bandwidth from volume Bragg grating M=$\Delta\lambda_M$, the optical bandwidth of volume Bragg grating M−1=$\Delta\lambda_{M-1}$ such that $\Delta\lambda_{M-1} \approx \Delta\lambda_M$ and $\lambda_c(\Delta\lambda_M) - \lambda_c(\Delta\lambda_{M-1}) \geq \Delta\lambda_{M-1}$, the optical bandwidth from volume Bragg grating M−2=$\Delta\lambda_{M-2}$, such that $\Delta\lambda_{M-2} \approx \Delta\lambda_M$ and $\lambda_c(\Delta\lambda_{M-1}) - \lambda_c(\Delta\lambda_{M-2}) \geq \Delta\lambda_{M-2}$, and so on; giving an arbitrary central blue wavelength $\lambda_c$, the optical bandwidth from optical coating X=$\Delta\lambda_X$, the optical bandwidth of optical coating X−1=$\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from optical coating X−2=$\lambda_{X-2}$, such that $\lambda_{X-2} \approx \Delta\lambda_X$ and $\lambda_c(\Delta\lambda_{X-1}) - \lambda_c(\lambda_{X-2}) \geq \Delta_{X-2}$, and so on; giving an arbitrary central blue wavelength $\lambda_c$, the optical bandwidth from optical coating X=$\Delta\lambda_X$ and the optical bandwidth of the sum of volume Bragg grating(s) $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from optical coating X−1=$\Delta\lambda_{X-1}$ and the optical bandwidth of the sum of volume Bragg grating(s) $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

Further there is provided these high power lasers, systems and methods having one or more of the following features: that utilizes the reflection volume Bragg grating(s) operating in the laser diode slow axis and TE-mode of the reflection volume Bragg grating(s), followed by optical coating(s) operating in the laser diode fast axis and TE-mode of the optical coating(s); that utilizes the reflection volume Bragg grating(s) operating in the laser diode fast axis and TE-mode of the reflection volume Bragg grating(s), followed by optical coating(s) operating in the laser diode slow axis and TE-mode of the optical coating(s); that utilizes the reflection volume Bragg grating(s) operating in the laser diode slow axis and TE-mode of the reflection volume Bragg grating(s), followed by optical coating(s) operating in the laser diode fast axis and TM-mode of the optical coating(s); that utilizes the reflection volume Bragg grating(s) operating in the laser diode fast axis and TE-mode of the reflection volume Bragg grating(s), followed by optical coating(s) operating in the laser diode slow axis and TM-mode of the optical coating(s); that utilizes the reflection volume Bragg grating(s) operating in the laser diode slow axis and TM-mode of the reflection volume Bragg grating(s), followed by optical coating(s) operating in the laser diode fast axis and TE-mode of the optical coating(s); that utilizes the reflection volume Bragg grating(s) operating in the laser diode fast axis and TM-mode of the reflection volume Bragg grating(s), followed by optical coating(s) operating in the laser diode slow axis and TE-mode of the optical coating(s); that utilizes the reflection volume Bragg grating(s) operating in the laser diode slow axis and TM-mode of the reflection volume Bragg grating(s), followed by optical coating(s) operating in the laser diode fast axis and TM-mode of the optical coating(s); that utilizes the reflection volume Bragg grating(s) operating in the laser diode fast axis and TM-mode of the reflection volume Bragg grating(s), followed by optical coating(s) operating in the laser diode slow axis and TM-mode of the optical coating(s); that utilizes the transmission volume Bragg grating(s) operating in the laser diode slow axis and TE-mode of the transmission volume Bragg grating(s), followed by optical coating(s) operating in the laser diode fast axis and TE-mode of the optical coating(s); that utilizes the transmission volume Bragg grating(s) operating in the laser diode fast axis and TE-mode of the transmission volume Bragg grating(s), followed by optical coating(s) operating in the laser diode slow axis and TE-mode of the optical coating(s); that utilizes the transmission volume Bragg grating(s) operating in the laser diode slow axis and TE-mode of the transmission volume Bragg grating(s), followed by optical coating(s) operating in the laser diode fast axis and TM-mode of the optical coating(s); that utilizes the transmission volume Bragg grating(s) operating in the laser diode fast axis and TE-mode of the transmission volume Bragg grating(s), followed by optical coating(s) operating in the laser diode slow axis and TM-mode of the optical coating(s); that utilizes the transmission volume Bragg grating(s) operating in the laser diode slow axis and TM-mode of the transmission volume Bragg grating(s), followed by optical coating(s) operating in the laser diode fast axis and TE-mode of the optical coating(s); that utilizes the transmission volume Bragg grating(s) operating in the laser diode fast axis and TM-mode of the transmission volume Bragg grating(s), followed by optical coating(s) operating in the laser diode slow axis and TE-mode of the optical coating(s); that utilizes the transmission volume Bragg grating(s) operating in the laser diode slow axis and TM-mode of the transmission volume Bragg grating(s), followed by optical coating(s) operating in the laser diode fast axis and TM-mode of the optical coating(s); and that utilizes the transmission volume Bragg grating(s) operating in the laser diode fast axis and TM-mode of the transmission volume Bragg grating(s), followed by optical coating(s) operating in the laser diode slow axis and TM-mode of the optical coating(s) in combination with an output coupler which defines the wavelength of each source and the co-linear propagation of each laser beam.

Yet further there is provided a laser source comprising of the following: one or more optical coatings followed by one or more volume Bragg gratings; the output light direction from the volume Bragg grating(s) is 90° with respect to the output light direction from the optical coating(s) as defined by the optical cavity completed by the output coupler; the brightness of the sum of the individual laser diode beams after being combined by the volume Bragg gratings(s) and the optical coating(s) is N times brighter than that of an individual laser diode beam, where N is the number of individual laser diode beams, B is the number of volume Bragg grating(s), and N/B is the number of individual laser diode beams being combined by the optical coating(s) as groups; the optical bandwidths of each individual combination of laser diodes combined by the volume Bragg grating(s) are mutually exclusive; the optical bandwidths of each individual combination of laser diodes combined by optical coating(s) are mutually exclusive; given an arbitrary central blue wavelength $\lambda_c$, the optical bandwidth from volume Bragg grating $M=\Delta\lambda_M$, the optical bandwidth of volume Bragg grating $M-1=\Delta\lambda_{M-1}$ such that $\Delta\lambda_{M-1}\approx\Delta\lambda_M$ and $\lambda_c(\Delta\lambda_M)-\lambda_c(\Delta\lambda_{M-1})\geq\Delta\lambda_{M-1}$, the optical bandwidth from volume Bragg grating $M-2=\Delta\lambda_{M-2}$, such that $\Delta\lambda_{M-2}\approx\Delta\lambda_M$ and $\lambda_c(\Delta\lambda_{M-1})-\lambda_c(\Delta\lambda_{M-2})\geq\Delta\lambda_{M-2}$, and so on; given an arbitrary central blue wavelength $\lambda_c$, the optical bandwidth from optical coating $X=\Delta\lambda_X$, the optical bandwidth of optical coating $X-1=\Delta\lambda_{X-1}$ such that $\Delta\lambda_{X-1}\approx\Delta\lambda_X$ and $\lambda_c(\Delta\lambda_X)-\lambda_c(\Delta\lambda_{X-1})\geq\Delta\lambda_{X-1}$, the optical bandwidth from optical coating $X-2=\Delta\lambda_{X-2}$, such that $\Delta\lambda_{X-2}\approx\Delta\lambda_X$ and $\lambda_c(\Delta\lambda_{X-1})-\lambda_c(\Delta\lambda_{X-2})\geq\Delta\lambda_{X-2}$, and so on; given an arbitrary central blue wavelength $\lambda_c$, the optical bandwidth from volume Bragg grating $X=\Delta\lambda_X$ and the optical bandwidth of the sum of coatings(s) $\Sigma\Delta\lambda_{M1}$ such that $\Delta\lambda_X\geq\Sigma\Delta\lambda_{M1}$ and $\lambda_c(\Delta\lambda_X)\approx\lambda_c(\Sigma\Delta\lambda_{M1})$, the optical bandwidth from volume Bragg grating $X-1=\lambda_{X-1}$ and the optical bandwidth of the sum of optical coating(s) $\Sigma\Delta\lambda_{M2}$ such that $\Delta\lambda_{X-1}\geq\Sigma\Delta\lambda_{M2}$ and $\lambda_c(\Delta\lambda_{X-1})\approx\lambda_c(\Sigma\Delta\lambda_{M2})$, and so on.

Further there is provide a laser source comprising of the following: one or more volume Bragg grating(s) followed by one or more volume Bragg grating(s); the output light direction from the following volume Bragg grating(s) is 90° with respect to the output light direction from the previous volume Bragg grating(s) as defined by the optical cavity completed by the output coupler; the brightness of the sum of the individual laser diode beams after being combined by the volume Bragg gratings(s) is N times brighter than that of an individual laser diode beam, with N is the number of individual laser diode beams, B is the number of secondary volume Bragg grating(s), and N/B is the number of individual laser diode beams being combined by the primary volume Bragg grating(s) as groups; the optical bandwidths of each individual combination of laser diodes combined by the primary volume Bragg grating(s) are mutually exclusive; the optical bandwidths of each individual combination of laser diodes combined by the secondary volume Bragg grating(s) are mutually exclusive; given an arbitrary central blue wavelength $\lambda_c$, the optical bandwidth from the primary volume Bragg grating $M=\Delta\lambda_M$, the optical bandwidth of the primary volume Bragg grating $M-1=\Delta\lambda_{M-1}$ such that $\Delta\lambda_{M-1}\approx\Delta\lambda_M$ and $\lambda_c(\Delta\lambda_M)-\lambda_c(\Delta\lambda_{M-1})\geq\Delta\lambda_{M-1}$, the optical bandwidth from the primary volume Bragg grating $M-2=\Delta\lambda_{M-2}$, such that $\Delta\lambda_{M-2}\approx\Delta\lambda_M$ and $\lambda_c(\Delta\lambda_{M-1})-\lambda_c(\Delta\lambda_{M-2})\geq\Delta\lambda_{M-2}$, and so on; given an arbitrary central blue wavelength $\lambda_c$, the optical bandwidth from the secondary volume Bragg grating $X=\Delta\lambda_X$, the optical bandwidth of secondary volume Bragg grating $X-1=\Delta\lambda_{X-1}$ such that $\Delta\lambda_{X-1}\approx\Delta\lambda_X$ and $\lambda_c(\Delta\lambda_X)-\lambda_c(\Delta\lambda_{X-1})\geq\Delta\lambda_{X-1}$, the optical bandwidth from secondary volume Bragg grating $X-2=\Delta\lambda_{X-2}$, such that $\Delta\lambda_{X-2}\approx\Delta\lambda_X$ and $\lambda_c(\Delta\lambda_{X-1})-\lambda_c(\Delta\lambda_{X-2})\geq\Delta\lambda_{X-2}$, and so on; given an arbitrary central blue wavelength $\lambda_c$, the optical bandwidth from the secondary volume Bragg grating $X=\Delta\lambda_X$ and the optical bandwidth of the sum of the primary volume Bragg gratings $\Sigma\Delta\lambda_{M1}$ such that $\Delta\lambda_X\geq\Sigma\Delta\lambda_{M1}$ and $\lambda_c(\Delta\lambda_X)\approx\lambda_c(\Sigma\Delta\lambda_{M1})$, the optical bandwidth from the secondary volume Bragg grating $X-1=\Delta\lambda_{X-1}$ and the optical bandwidth of the sum of the primary volume Bragg gratings $\Sigma\Delta\lambda_{M2}$ such that $\Delta\lambda_{X-1}\geq\Sigma\Delta\lambda_{M2}$ and $\lambda_c(\Delta\lambda_{X-1})\approx\lambda_c(\Sigma\Delta\lambda_{M2})$, and so on.

Moreover, there is provided a laser source or method having one or more of the following features: that utilizes the primary reflection volume Bragg grating(s) operating in the laser diode slow axis and TE-mode of the primary reflection volume Bragg grating(s), followed by secondary reflection volume Bragg grating(s) operating in the laser diode fast axis and TE-mode of the secondary reflection volume Bragg grating(s); that utilizes the primary reflection volume Bragg grating(s) operating in the laser diode fast axis and TE-mode of the optical coating(s), followed by reflection volume Bragg grating(s) operating in the laser diode slow axis and TE-mode of the reflection volume Bragg grating(s); that utilizes the primary reflection volume Bragg grating(s) operating in the laser diode slow axis and TE-mode of the optical coating(s), followed by secondary reflection volume Bragg grating(s) operating in the laser diode fast axis and TM-mode of the secondary reflection volume Bragg grating(s); that utilizes the primary reflection volume Bragg grating(s) operating in the laser diode fast axis and TE-mode of the optical coating(s), followed by secondary reflection volume Bragg grating(s) operating in the laser diode slow axis and TM-mode of the secondary reflection volume Bragg grating(s); that utilizes the primary reflection volume Bragg grating(s) operating in the laser diode slow axis and TM-mode of the optical coating(s), followed by secondary reflection volume Bragg grating(s) operating in the laser diode fast axis and TE-mode of the secondary reflection volume Bragg grating(s); that utilizes the primary reflection volume Bragg grating(s) operating in the laser diode fast axis and TM-mode of the optical coating(s), followed by secondary reflection volume Bragg grating(s)operating in the laser diode slow axis and TE-mode of the secondary reflection volume Bragg grating(s); that utilizes the primary reflection volume Bragg grating(s) operating in the laser diode slow axis and TM-mode of the optical coating(s), followed by secondary reflection volume Bragg grating(s) operating in the laser diode fast axis and TM-mode of the secondary reflection volume Bragg grating(s); that utilizes the primary reflection volume Bragg grating(s) operating in the laser diode fast axis and TM-mode of the optical coating(s), followed by secondary reflection volume Bragg grating(s) operating in the laser diode slow axis and TM-mode of the secondary reflection volume Bragg grating(s); that utilizes the primary reflection volume Bragg grating(s) operating in the laser diode slow axis and TE-mode of the primary reflection volume Bragg grating(s), followed by secondary transmission volume Bragg grating(s) operating in the laser diode fast axis and TE-mode of the secondary transmission volume Bragg grating(s); that utilizes the primary reflection volume Bragg grating(s) operating in the laser diode fast axis and TE-mode of the primary reflection volume Bragg grating(s), followed by secondary transmission volume Bragg grating(s) operating in the laser diode slow axis and TE-mode of the secondary transmission volume Bragg grating(s); that utilizes the primary reflection volume Bragg grating(s) operating in the laser diode slow axis and TE-mode of the primary reflection volume Bragg grating(s), followed by secondary transmission volume Bragg grating(s) operating in the laser diode fast axis and TM-mode of the secondary transmission volume Bragg grating(s); that utilizes the primary reflection volume Bragg grating(s) operating in the laser diode fast axis and TE-mode of the primary reflection volume Bragg grating(s), followed by secondary transmission volume Bragg grating(s) operating in the laser diode slow axis and TM-mode of the secondary transmission volume Bragg grating(s); that utilizes the primary reflection volume Bragg grating(s) operating in the laser diode slow axis and TM-mode of the primary reflection volume Bragg grating(s), followed by secondary transmission volume Bragg grating(s) operating in the laser diode fast axis and TE-mode of the secondary transmission volume Bragg grating(s); that utilizes the primary reflection volume Bragg grating(s) operating in the laser diode fast axis and TM-mode of the primary reflection volume Bragg grating(s), followed by secondary transmission volume Bragg grating(s) operating in the laser diode slow axis and TE-mode of the secondary transmission volume Bragg grating(s); that utilizes the primary reflection volume Bragg grating(s) operating in the laser diode slow axis and TM-mode of the primary reflection volume Bragg grating(s), followed by secondary transmission volume Bragg grating(s) operating in the laser diode fast axis and TM-mode of the secondary transmission volume Bragg grating(s); that utilizes the primary reflection volume Bragg grating(s) operating in the laser diode fast axis and TM-mode of the primary reflection volume Bragg grating(s), followed by secondary transmission volume Bragg grating(s) operating in the laser diode slow axis and TM-mode of the secondary transmission volume Bragg grating(s); that utilizes the primary transmission volume Bragg grating(s) operating in the laser diode slow axis and TE-mode of the primary transmission volume Bragg grating(s), followed by secondary reflection volume Bragg grating(s) operating in the laser diode fast axis and TE-mode of the secondary reflection volume Bragg grating(s); that utilizes the primary transmission volume Bragg grating(s) operating in the laser diode fast axis and TE-mode of the primary transmission volume Bragg grating(s), followed by secondary reflection volume Bragg grating(s) operating in the laser diode slow axis and TE-mode of the secondary reflection volume Bragg grating(s); that utilizes the primary transmission volume Bragg grating(s) operating in the laser diode slow axis and TE-mode of the primary transmission volume Bragg grating(s), followed by secondary reflection volume Bragg grating(s) operating in the laser diode fast axis and TM-mode of the secondary reflection volume Bragg grating(s); that utilizes the primary transmission volume Bragg grating(s) operating in the laser diode fast axis and TE-mode of the primary transmission volume Bragg grating(s), followed by secondary reflection volume Bragg grating(s) operating in the laser diode slow axis and TM-mode of the secondary reflection volume Bragg grating(s); that utilizes the primary transmission volume Bragg grating(s) operating in the laser diode slow axis and TM-mode of the primary transmission volume Bragg grating(s), followed by secondary reflection volume Bragg grating(s) operating in the laser diode fast axis and TE-mode of the secondary reflection volume Bragg grating(s); that utilizes the primary transmission volume Bragg grating(s) operating in the laser diode fast axis and TM-mode of the primary transmission volume Bragg grating(s), followed by secondary reflection volume Bragg grating(s) operating in the laser diode slow axis and TE-mode of the secondary reflection volume Bragg grating(s); that utilizes the primary transmission volume Bragg grating(s) operating in the laser diode slow axis and TM-mode of the primary transmission volume Bragg grating(s), followed by secondary transmission volume Bragg grating(s) operating in the laser diode fast axis and TE-mode of the secondary transmission volume Bragg grating(s); that utilizes the primary transmission volume Bragg grating(s) operating in the laser diode fast axis and TE-mode of the primary transmission volume Bragg grating(s), followed by secondary transmission volume Bragg grating(s)

operating in the laser diode slow axis and TE-mode of the secondary transmission volume Bragg grating(s); that utilizes the primary transmission volume Bragg grating(s) operating in the laser diode slow axis and TE-mode of the primary transmission volume Bragg grating(s), followed by secondary transmission volume Bragg grating(s) operating in the laser diode fast axis and TM-mode of the secondary transmission volume Bragg grating(s); that utilizes the primary transmission volume Bragg grating(s) operating in the laser diode fast axis and TE-mode of the primary transmission volume Bragg grating(s), followed by secondary transmission volume Bragg grating(s) operating in the laser diode slow axis and TM-mode of the secondary transmission volume Bragg grating(s); that utilizes the primary transmission volume Bragg grating(s) operating in the laser diode slow axis and TM-mode of the primary transmission volume Bragg grating(s), followed by secondary transmission volume Bragg grating(s) operating in the laser diode fast axis and TE-mode of the secondary transmission volume Bragg grating(s); that utilizes the primary transmission volume Bragg grating(s) operating in the laser diode fast axis and TM-mode of the primary transmission volume Bragg grating(s), followed by secondary transmission volume Bragg grating(s) operating in the laser diode slow axis and TE-mode of the secondary transmission volume Bragg grating(s); that utilizes the primary transmission volume Bragg grating(s) operating in the laser diode slow axis and TM-mode of the primary transmission volume Bragg grating(s), followed by secondary transmission volume Bragg grating(s) operating in the laser diode fast axis and TM-mode of the secondary transmission volume Bragg grating(s); and, that utilizes the primary transmission volume Bragg grating(s) operating in the laser diode fast axis and TM-mode of the primary transmission volume Bragg grating(s), followed by secondary transmission volume Bragg grating(s) operating in the laser diode slow axis and TM-mode of the secondary transmission volume Bragg grating(s) with the final element being a output coupler which defines the optical cavity through each of the Bragg gratings to define the wavelength of each laser source from the feedback from the output coupler.

Moreover there is provided a laser source comprising of the following: one or more optical coatings(s) as described in claim 30 followed by one or more optical coating(s) as described in claim 30; the output light direction from the following optical coating(s) is 90° with respect to the output light direction from the previous optical coating(s) and an output coupler to complete the optical cavity and provide the roundtrip optical path to define the wavelength of each laser diode source; the brightness is now the sum of the individual laser diode beams after being combined by the optical coating(s) N times brighter than that of an individual laser diode beam, with N is the number of individual laser diode beams, C is the number of secondary optical coating(s), and N/C is the number of individual laser diode beams being combined by the primary optical coatings(s) as groups; the optical bandwidths of each individual combination of laser diodes combined by the primary optical coatings(s) are mutually exclusive; the optical bandwidths of each individual combination of laser diodes combined by the secondary optical coating(s) are mutually exclusive; given an arbitrary central blue wavelength $\lambda_c$, the optical bandwidth from the primary optical coating $M=\Delta\lambda_M$, the optical bandwidth of the primary optical coating $M-1=\Delta\lambda_{M-1}$ such that $\Delta\lambda_{M-1} \Delta\lambda_M$ and $\lambda_c(\Delta\lambda_m)-\lambda_c(\Delta\lambda_{M-1})\geq\Delta\lambda_{M-1}$, the optical bandwidth from the primary optical coating $M-2$ $\Delta\lambda_{M-2}$, such that $\Delta\lambda_{M-2}=\Delta\lambda_M$ and $\lambda_c(\lambda_{M-1})-\lambda_c(\Delta\lambda_{M-2})\geq\Delta\lambda_{M-2}$, and so on; given an arbitrary central blue wavelength $\lambda_c$, the optical bandwidth from the secondary optical coating $X=\Delta\lambda_X$, the optical bandwidth of secondary optical coating $X-1=\Delta\lambda_{X-1}$ such that $\Delta\lambda_{X-1}\approx\Delta\lambda_X$ and $\lambda_c(\Delta\lambda_X)-\lambda_c(\Delta\lambda_{X-1})\geq\Delta\lambda_{X-1}$, the optical bandwidth from secondary optical coating $X-2=\Delta\lambda_{X2}$, such that $\Delta\lambda_{X-2}\approx\Delta\lambda_X$ and $\lambda_c(\Delta\lambda_{X-1})-\lambda_c(\Delta\lambda_{X-2})\geq\Delta\lambda_{X-2}$, and so on; given an arbitrary central blue wavelength $\lambda_c$, the optical bandwidth from the secondary coating $X=\Delta\lambda_X$ and the optical bandwidth of the sum of the primary optical coatings $\Sigma\Delta\lambda_{M1}$ such that $\Delta\lambda_X\geq\Sigma\Delta\lambda_{M1}$ and $\lambda_c(\Delta\lambda_X)\approx\lambda_c(\Sigma\Delta\lambda_{M1})$, the optical bandwidth from the secondary optical coating $X-1=\Delta\lambda_{X-1}$ and the optical bandwidth of the sum of the primary optical coatings $\Sigma\Delta\lambda_{M2}$ such that $\Delta\lambda_{X-1}\geq\Sigma\Delta\lambda_{M2}$ and $\lambda_c(\Delta\lambda_{X-1})\approx\lambda_c(\Sigma\Delta\lambda_{M2})$, and so on.

Further there is provided these high power lasers, systems and methods having one or more of the following features: that utilizes the primary optical coating(s) operating in the laser diode slow axis and TE-mode of the primary optical coating(s), followed by secondary optical coating(s) operating in the laser diode fast axis and TE-mode of the secondary optical coating(s); that utilizes the primary optical coating(s) operating in the laser diode fast axis and TE-mode of the optical coating(s), followed by secondary optical coating(s) operating in the laser diode slow axis and TE-mode of the secondary optical coating(s); that utilizes the primary optical coating(s) operating in the laser diode slow axis and TE-mode of the optical coating(s), followed secondary optical coating(s) operating in the laser diode fast axis and TM-mode of the secondary optical coating(s); that utilizes the primary optical coating(s) operating in the laser diode fast axis and TE-mode of the optical coating(s), followed by secondary optical coating(s) operating in the laser diode slow axis and TM-mode of the secondary optical coating(s); that utilizes the primary optical coating(s) operating in the laser diode slow axis and TM-mode of the optical coating(s), followed by secondary optical coating(s) operating in the laser diode fast axis and TE-mode of the secondary optical coating(s); that utilizes the primary optical coating(s) operating in the laser diode fast axis and TM-mode of the optical coating(s), followed by secondary optical coating(s) operating in the laser diode slow axis and TE-mode of the secondary optical coating(s); that utilizes the primary optical coating(s) operating in the laser diode slow axis and TM-mode of the optical coating(s), followed by secondary optical coating(s) operating in the laser diode fast axis and TM-mode of the secondary optical coating(s); that utilizes the primary optical coating(s) operating in the laser diode fast axis and TM-mode of the optical coating(s), followed by secondary optical coating(s) operating in the laser diode slow axis and TM-mode of the secondary optical coating(s) with an output coupler at the exit of the system providing the optical feedback to each of the laser diode sources through the filter system described; operating in the 400-500 nm range with an output power of >1 Watt and a beam parameter product of 5 mm-mrad and larger; operating in the 500-600 nm range with an output power of >1 Watt and a beam parameter product of 5 mm-mrad and larger; operating in the 720-800 nm range with an output power of >1 Watt and a beam parameter product of 5 mm-mrad and larger; and, operating in the 800-900 nm range with an output power of >1 Watt and a beam parameter product of 5 mm-mrad and larger.

Moreover, there is provided a high power, high brightness laser system, having: a plurality of laser diodes, each having a power of not less than 0.25 W, wherein each of the plurality of laser diodes is configured to provide a laser beam along a laser beam path; a common external cavity shared by each of the plurality of laser diodes; a collimating optic in the laser beam paths for creating parallel beams from each of the plurality of laser diodes; a beam combination optic in the common external cavity and in the laser beam paths; wherein the beam combination optic determines the wavelength of each laser diode and aligns each laser beam path from the plurality of laser diodes to be co-linear and overlapping in space, whereby a composite output laser beam is provided; and, the spatial brightness of the composite output laser beam is n times the brightness of any single laser diode in the plurality of laser diodes, where brightness is defined as the combined power divided by the aperture-divergence product.

Still further there is provided these laser systems and methods having one or more of the following features: wherein the beam combination optic is a set of optical filters that are used at the edge of either the low pass or high pass end of the spectrum for a bandpass filter; operating in the 400-500 nm range with an output power of not less than 100 Watts and a beam parameter product of 0.1 mm-mrad and larger; operating in the 500-600 nm range with an output power of not less than 100 Watts and a beam parameter product of 0.1 mm-mrad and larger; operating in the 720-800 nm range with an output power not less than 100 Watts and a beam parameter product of 0.1 mm-mrad and larger; operating in the 800-900 nm range with an output power of not less than 100 Watts and a beam parameter product of 0.1 mm-mrad and larger; operating in the 900-1200 nm range with an output power of not less than 100 Watts and a beam parameter product of 0.1 mm-mrad and larger; operating in the 1200 nm-1120 nm range with an output power of not less than 100 Watts and a beam parameter product of 0.1 mm-mrad and larger; operating in the 1400-1500 nm range with an output power of not less than 100 Watts and a beam parameter product of 0.1 mm-mrad and larger; operating in the 1500-2200 nm range with an output power of not less than 100 Watts and a beam parameter product of 0.1 mm-mrad and larger; wherein the plurality of laser diodes are inter-band cascade lasers; and where in the system is operating in the 2200-3000 nm range with an output power of not less than 100 Watts and a beam parameter product of 0.1 mm-mrad and larger; wherein the beam combination optic comprises a plurality of volume Bragg grating filters; wherein a first volume Bragg gratings is configured to redirect a portion of the optical spectrum of a first laser beam from a first laser diode in the plurality of laser diodes to be collinear with the laser beam from a second laser diode in the plurality of laser diodes; and, wherein the plurality of laser diodes are quantum cascade lasers and the system is operating in the 3000 nm 12000 nm range with an output power of not less than 100 Watts and a beam parameter product of 0.1 mm-mrad and larger;

Additionally, there is provided these laser systems and methods having one or more of the following features: wherein n is not less than 25; wherein the beam combination optic comprises a plurality of volume Bragg grating filters; wherein a first volume Bragg gratings is configured to redirect a portion of the optical spectrum of a first laser beam from a first laser diode in the plurality of laser diodes to be collinear with the a laser beam from a second laser diode in the plurality of laser diodes; and wherein n is not less than 25; wherein the plurality of laser diodes consists of N diodes; wherein each of the N diodes defines a $1^{st}$ peak of a lasing spectra; wherein the beam combining optic consists of a plurality of volume Bragg grating consisting of N−1 volume Bragg grating filters and an output coupler; the volume Bragg gratings and N−1 of the laser diodes configured in an optical association such that points of maximum transmission through each volume Bragg grating of the plurality of volume Bragg gratings coincide with the N−1, N−2 to N−(N−1) $1^{st}$ peak of N−1 laser diodes in the plurality of laser diodes; whereby the N is equal to n; wherein N−1 is equal to n; and wherein laser diode N' is not optically associated with a volume Bragg grating and the system provides the maximum beam deflection of laser diode N'.

Yet additionally there is provided a high power, high brightness laser system having: a plurality of N laser diodes, wherein each of the plurality of laser diodes is configured to provide a laser beam along a laser beam path at a laser beam power; wherein the laser beam path comprises an output propagation direction; a common external cavity shared by each of the plurality of laser diodes; a collimating optic in the output propagation direction laser beam paths for creating parallel beams from each of the plurality of laser diodes; a beam combination optic in the common external cavity and in the output propagation direction laser beam paths; wherein the beam combining optic comprises N−1 optical elements having optical coatings, whereby the optical elements redirect a portion of the optical spectrum of the laser beam from a laser diode in the plurality of laser diodes at an angle up to 90° with respect to the output propagation direction laser beam paths, thereby providing a composite output laser beam defining a brightness; and, whereby the brightness of the composite output laser beam is n times the brightness of any single laser diode in the plurality of laser diodes, where brightness is defined as the combined power divided by the aperture-divergence product.

Still further there is provided these laser systems and methods having one or more of the following features: wherein N=n; wherein N−1=n.

Still further there is provided these laser systems and methods having one or more of the following features: operating in the 400-500 nm range with an output power of not less than 10 W and a beam parameter product of 0.1 mm-mrad and larger; operating in the 500-600 nm range with an output power of not less than 10 W and a beam parameter product of 0.1 mm-mrad and larger; wherein the laser beam power is not less than 0.5 W; and, wherein the laser beam power is not less than 1 W.

In addition there is provided a high power, high brightness laser system having: a plurality of N laser diodes, wherein each of the plurality of laser diodes is configured to provide a laser beam along a laser beam path at a laser beam power; wherein the laser beam path comprises an output propagation direction; a common external cavity shared by each of the plurality of laser diodes; a collimating optic in the output propagation direction laser beam paths for creating parallel beams from each of the plurality of laser diodes; a beam combination optic in the common external cavity and in the output propagation direction laser beam paths; wherein the beam combining optic comprises N−1 optical elements; wherein the optical elements consist of volume Bragg gratings and optical coatings elements, wherein the volume Bragg gratings and the optical coating elements follow each other along the laser beam paths; wherein an output light direction from the optical coating is 90° with respect to the output light direction from the volume Bragg grating, thereby providing a combined output laser beam defining a brightness; and, the brightness of the sum of the individual laser diode beams after being combined by the volume Bragg gratings and the optical coatings is n times brighter than that of an individual laser diode beam; wherein n=N or n=N−1, N is the number of individual laser diode beams, C is the number of optical coatings, and N/C is the number of individual laser diode beams being combined by the volume Bragg gratings and the output coupler.

Still further there is provided a high power, high brightness laser system having: a plurality of N laser diodes, wherein each of the plurality of laser diodes is configured to provide a laser beam along a laser beam path at a laser beam power; wherein the laser beam path comprises an output propagation direction; a common external cavity shared by each of the plurality of laser diodes; a collimating optic in the output propagation direction laser beam paths for creating parallel beams from each of the plurality of laser diodes; a beam combination optic in the common external cavity and in the output propagation direction laser beam paths; wherein the beam combining optic comprises N−1 optical elements; wherein the optical elements consist of volume Bragg gratings and optical coatings elements, wherein the volume Bragg gratings and the optical coating elements follow each other along the laser beam paths; wherein an output light direction from the volume Bragg grating is 90° with respect to the output light direction from the optical coating element, thereby providing a combined output laser beam defining a brightness; and, the brightness of the sum of the individual laser diode beams after being combined by the volume Bragg gratings and the optical coatings is n times brighter than that of an individual laser diode beam; wherein n=N or n=N−1, N is the number of individual laser diode beams, B is the number of volume Bragg gratings, and N/B is the number of individual laser diode beams being combined by the optical coatings as groups.

Additionally, there is provided these laser systems and methods having one or more of the following features: wherein, the optical bandwidths of each individual combination of laser diodes combined by the volume Bragg grating(s) and output coupler in an external cavity are mutually exclusive; wherein, given an arbitrary central blue wavelength $\lambda_c$, the optical bandwidth from volume Bragg grating M=$\Delta\lambda_M$, the optical bandwidth of volume Bragg grating M−1=$\Delta\lambda_{M-1}$ such that $\Delta\lambda_{M-1} \approx \Delta\lambda_M$ and $\lambda_c(\Delta\lambda_M) - \lambda_c(\Delta\lambda_{M-1}) \geq \Delta\lambda_{M-1}$, the optical bandwidth from volume Bragg grating M−2=$\Delta\lambda_{M-2}$, such that $\Delta\lambda_{M-2} \approx \Delta\lambda_M$ and $\lambda_c(\Delta\lambda_{M-1}) - \lambda_c(\Delta\lambda_{M-2}) \geq \Delta\lambda_{M-2}$, and so on; wherein given an arbitrary central blue wavelength $\lambda_c$, the optical bandwidth from optical coating X=$\Delta\lambda_X$, the optical bandwidth of optical coating X−1=$\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from optical coating X−2=$\Delta\lambda_{X-2}$, such that $\Delta\lambda_{X-2} \approx \Delta\lambda_X$ and $\lambda_c(\Delta\lambda_{X-1}) - \lambda_c(\Delta\lambda_{X-2}) \geq \Delta\lambda_{X-2}$, and so on; and, wherein given an arbitrary central blue wavelength $\lambda_c$, the optical bandwidth from optical coating X=$\Delta\lambda_X$ and the optical bandwidth of the sum of volume Bragg grating(s) $\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from optical coating X−1=$\Delta\lambda_{X-1}$ and the optical bandwidth of the sum of volume Bragg grating(s) $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on Moreover, there is provided a high power, high brightness laser system having: a plurality of N laser diodes, wherein each of the plurality of laser diodes is configured to provide a laser beam along a laser beam path at a laser beam power; wherein the laser beam path comprises an output propagation direction; a common external cavity shared by each of the plurality of laser diodes; a collimating optic in the output propagation direction laser beam paths for creating parallel beams from each of the plurality of laser diodes; a beam combination optic in the common external cavity and in the output propagation direction laser beam paths; wherein the beam combining optic comprises N−1 optical elements; wherein the optical elements comprises: a first means for determining the wavelength of a laser diode beam and directing the laser diode beam path in an output path; a second means for determining the wavelength of a laser diode beam and directing the laser diode beam path in an output path; wherein the output path for the first means is 90° with respect to the output path for the second means, thereby providing a combined output laser beam defining a brightness; and, the brightness of the sum of the individual laser diode beams after being combined by the first means and the second means is n times brighter than that of an individual laser diode beam; wherein n=N or n=N−1, N is the number of individual laser diode beams, E' is the number of first or the number of second means, and N/E' is the number of individual laser diode beams being combined by the first means or the second means as groups.

Additionally, there is provided these laser systems and methods having one or more of the following features: wherein the first means is a primary volume Bragg grating; wherein the second means is a secondary volume Bragg grating; wherein the first means is a primary coating; wherein the second means is a secondary coating wherein the output coupler is a partially reflective element which may be an optical coating or a volume Bragg grating; wherein the system is in operating in the 400-500 nm wavelength range; wherein the system is in operating in the 500-600 nm wavelength range; wherein the system is in operating in the 720-800 nm wavelength range; and wherein the system is in operating in the 800-900 nm wavelength range.

DESCRIPTION OF THE PREFERRED EMBODIMENTS

Figure 1:
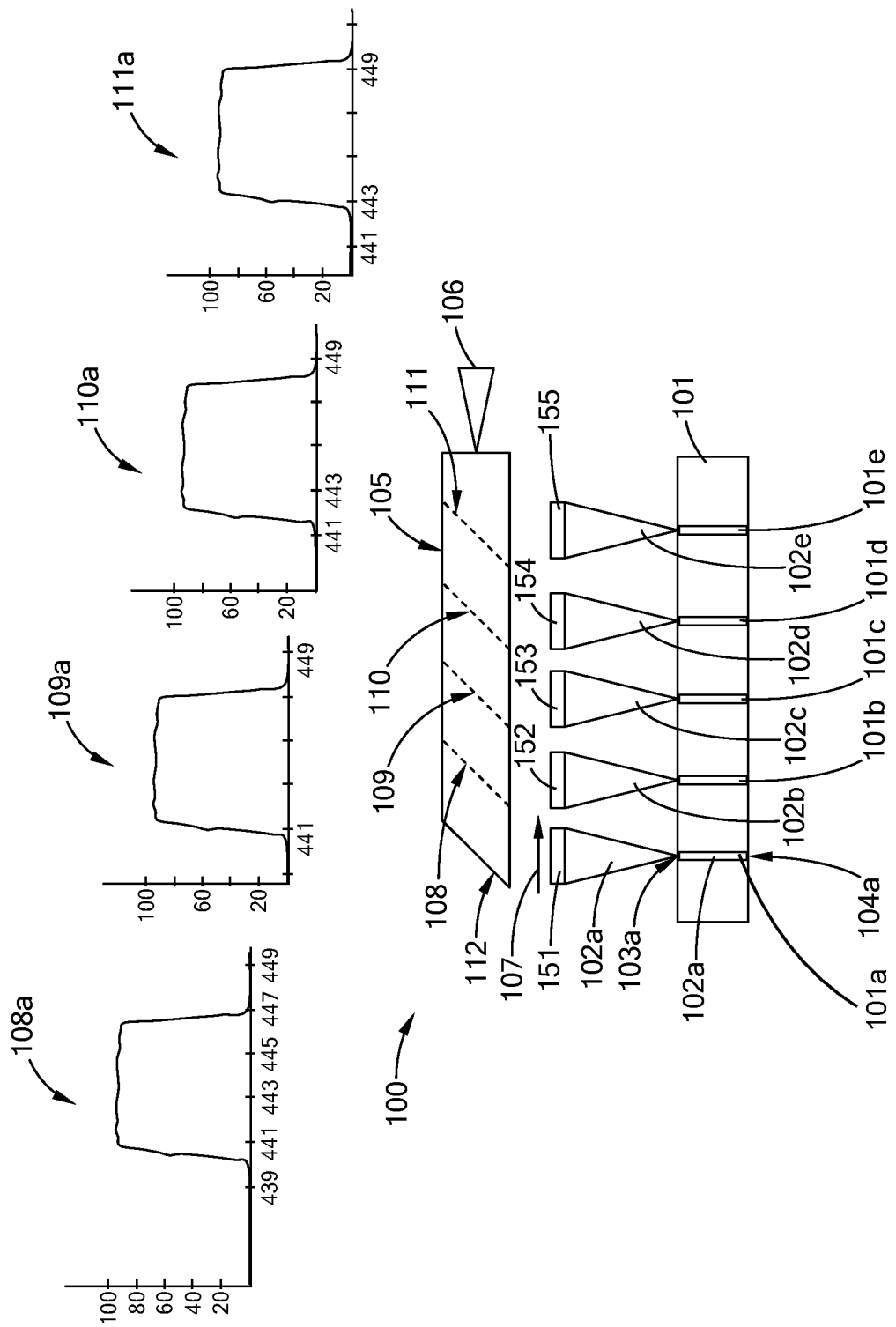
FIGS. 1 and 1A are schematics of an embodiment of an external cavity laser system in accordance with the present inventions showing multiple laser diodes combined by a feedback signal from an output coupler integral to the combiner block, which forces each laser diode to operate at a specific wavelength.

In general, the present inventions relate to methods, systems and apparatus for the spectral beam combining of laser beams to provide higher brightness laser beams. In particular, embodiments of the present inventions relate to the combining of lower brightness laser beams, such as the beams from laser diodes, into high brightness laser beams, which are comparable to the laser beams obtained from fiber lasers.

Generally, an embodiment of the present invention is a high-power diode laser system capable of high power and high brightness operation using two or more individual laser diodes in a common external cavity. The laser can be used in various applications, such as materials processing, laser-assisted deposition manufacturing, and pumping of other laser gain medium. The output from the common external cavity of the laser increases the brightness by spectral beam combination in the fast axis, slow axis, or both axes simultaneously. This method of spectral beam combining is more elegant and less complex than all other previous beam combination methods envisioned for laser diode arrays.

Embodiments of the present inventions provide high brightness laser beams having narrow spectral bandwidth. This narrow spectral bandwidth can have advantages in pumping rare earth fiber lasers, rare earth lasers, Raman lasers and Raman fiber lasers.

Embodiments of the present inventions are useful in, for example, welding, cutting, surface cladding and 3-D printing, as well as for a pump source for other laser systems, and other applications. Embodiments of the present inventions provide laser beam brightness that are equal to and competitive with current fiber lasers, e.g., the laser beams of the present inventions having about 1 kW to about 10 kW, 2 kW to 8 kW, about 5 W to about 20 kW and all powers within these ranges, as well as greater and lower powers, and for these powers having BPP (Beam Parameter Products) of from about 1 mm mrad to about 40 mm mrad, about 30 mm mrad to about 35 mm mrad, and all values within these ranges, as well as greater and lower values.

Embodiments of the present inventions are a novel way for increasing the spatial brightness of a laser diode array, and provide a high brightness laser beam from a highly compact system, e.g., having a maximum dimension, either length, width or cross section of less than about 100 cm, less than about 5 cm, from about 5 cm to about 200 cm, all sizes within these ranges, and larger and smaller sizes, and also, among other things, greatly simplify the manufacturability of a spectral beam combined laser diode array.

This invention applies to all wavelengths of laser diodes. Thus, to the extent that this specification focusses on embodiments and examples for producing high power, high brightness laser sources in the visible spectrum using the high power visible blue laser diodes, the application of the present inventions and their scope should not be so limited.

Embodiments of the present inventions answer the need for the ability to laser process high reflectivity materials that are very difficult, if not impossible to process with IR lasers. Visible laser light, preferable green and blue laser light and more preferably blue laser light is typically strongly absorbed by materials that are highly reflective in the IR. Thus, blue laser light, with the increased brightness obtained through the present embodiments of spectral beam combining systems is ideal for processing materials such as copper, gold, aluminum, copper to aluminum, copper to steel, gold to aluminum, gold to steel, copper to nickel copper powder, aluminum powder, copper allows, aluminum alloys, titanium alloys, nickel alloys, etc.

Embodiments of the present invention greatly simplifies the wavelength beam combination method by using dichroic filters or volume Bragg gratings in an external cavity to combine the outputs of N-laser diodes, thus preferably eliminating the need for a separate wavelength control element on each laser diode. The laser diodes are first anti-reflection (AR) coated or low-reflection coated on the front facet making the laser diode a gain element, which is ideal for integrating into an external cavity. The High Reflectivity (HR) coating on the back facet of the laser diodes is broadband (>20 nm) and generally does not need to be modified. Each filter in the external cavity may be either a low pass, high pass or bandpass filter as long as the overlapping transmission functions result in a separation of the passbands by a predetermined amount. This filter is placed in the collimated output of N-lasers where the value of N is determined by the final bandwidth needed for the laser source and the overlapping passbands of each filter which sets the channel spacing.

In an embodiment using single mode diodes, the divergence could be 0.1 mm-mrad. In embodiments the beam combining optic consists of the optical filters in an optical cavity where the round trip from the diode to the output coupler through the filter defines the oscillating wavelength of each diode element. In an embodiment, the bandpass filters are individual elements with air between each filter. In an embodiment the bandpass filters are assembled into a monolithic optical element assembled with, for example, either optical bonding or transparent glue.

Turning to FIG. 1 there is shown an external cavity beam combining assembly 100. The assembly 100 has a laser diode source 101, e.g., an array of laser diodes, a laser diode bar, or a collection of individual chips. The assembly has collimating optics 151, 152, 153, 154, 155 (preferably providing laser beams collimated in the slow axis, the fast axis or both). The laser diode source has individual laser diodes 101*a*, 101*b*, 101*c*, 101*d*, 101*e*. The laser diode source 101 provides laser beams, 102*a*, 102*b*, 102*c*, 102*d*, 102*e*, which travel along laser beam paths that are parallel. The laser beams have a direction of polarization as shown by arrow 107 (TE with respect to the diode laser, TM with respect to the coating). The laser diodes, e.g., 101*a*, each have a surface or face, e.g., 103*a*, having an AR (anti-reflection) coating or low-reflection coating. The laser diodes, e.g., 101*a*, each have a surface or face, e.g., 104*a*, having an HR (high-reflection) coating. The laser beams, e.g., 102*a*, travel along their beam paths to an integral stack and optical coupler 105. The stack and optical coupler 105 has TIR (total internal reflation) surface 112, such that the laser beam 102*a* is directed along the stack's length and combined with laser beams 102*b*, 102*b*, 102*c*, 102*d*, and 102*e*, which are directed by and filtered by filters 108, 109, 110, 111, to provide laser beam 106. The integral stack may have the coatings immersed in the glass assembly, or the may be individual glass parts with and air gap on one side of the optical coating to enable a much steeper band edge, and optical coupler 105, has a first transmission filter 108, a second transmission filter 109, a third transmission filter 110, and a fourth transmission filter 111. The first transmission filter 108 has a 446.25 nm Band Edge and a 6 nm Bandpass, which is depicted by the transmission profile 108*a* (for each of these profiles the y-axis is % transmission and the x-axis is wavelength in nm). The second transmission filter 109 has a 447 nm Band Edge and a 6 nm Bandpass, which is depicted by transmission profile 109*a*. The third transmission filter 110 has a 447.75 nm Band Edge and a 6 nm Bandpass, which is depicted by transmission profile 110*a*. The fourth transmission filter 111 has a 448.5 nm Band Edge and a 6 nm Bandpass, which is depicted by transmission profile 110*a*.

In an embodiment the laser beams leaving the collimated laser diode device have a divergence of 4.5 mrad divergence in the slow axis. The laser beams can have divergent axis from about 0.1 mrad to about 5 mrad for this case because the laser beam divergence determines the steepness of the filter band edge, the larger the divergence, the less sharp the band-edge and consequently the broader spacing required for each filter, and all divergences within this range, as well as larger and smaller divergences.

In embodiments the external cavity beam combining assembly can have 1, 2, 10, 20, a dozen, dozens, and hundreds of laser diodes, and corresponding filters. The assembly can have 1, 2, 10, 20 or more laser diode bars, and corresponding filters for each laser diode in the bar. Preferably, each diode laser is optically associated with (i.e., they are on the laser beam path for that diode laser) its own filter; however in embodiments, 1, 2, 3 or more laser diodes can be optically associated with a single filter.

Figure 1A:
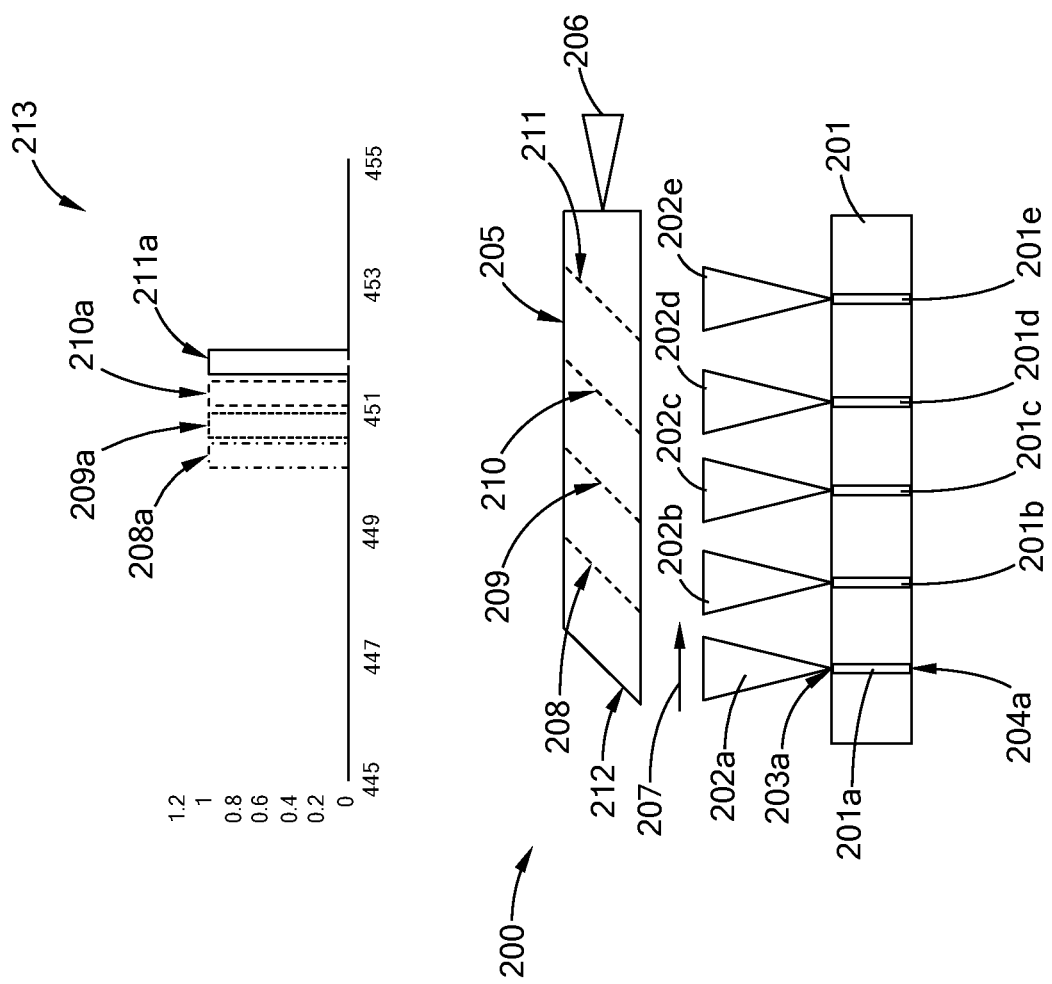

Turning to FIG. 1A there is shown an external cavity beam combining assembly 200. The assembly 200 has a laser diode source 201, (preferably providing laser beams collimated in the slow axis, the fast axis or both) e.g., an array of laser diodes, a laser diode bar, or a collection of individual chips. The laser diode source has individual laser diodes 201*a*, 201*b*, 201*c*, 201*d*, 201*e*. The laser diode source 201 provides laser beams, 202*a*, 202*b*, 202*c*, 202*d*, 202*e*, which travel along laser beam paths that are coincident with the laser beams. The laser beams have a direction of polarization as shown by arrow 207. The laser diodes, e.g., 201*a*, each have a surface or face, e.g., 203*a*, having an AR (anti-reflection) coating. The laser diodes, e.g., 201*a*, each have a surface or face, e.g., 204*a*, having an HR (high-reflection) coating. The laser beams, e.g., 202*a*, travel along their beam paths to an stack of optical filters which may be integral or discrete with an air gap to one side and an optical coupler 205. The integral stack and optical coupler 205 has TIR (total internal reflation) surface, 212, such that the laser beam 202*a* is directed along the length of the stack and combined with laser beams 202*b*, 202*b*, 202*c*, 202*d*, and 202*e*, which are directed and filtered by VBG notch filters 208, 209, 210, 211, to provide laser beam 206. The integral optical coupler 205, has a first VBG notch filter 208, a second VBG notch filter 209, a third VBG notch filter 210, a fourth VBG notch filter 211. The reflection spectrum on the combined VGBs is shown by graph 213 (y-axis is % transmission and the x-axis is wavelength in nm); showing the reflection spectrums for first VBG notch filter 208*a*, the second VBG notch filter 209*a*, the third VBG notch filter 210*a*, and the fourth VBG notch filter 211*a*. VBGs enable the channel spacing to be substantially closer then with bandpass filter elements.

As used herein, the "external cavity" refers to the space or area that is outside of, or away from the laser diode source, and in general is formed in, and includes, an optical block, optical blocks or optical components or similar type structures. For example, the external cavity is formed by an integral optical coupler, or the stack of filters and coupler. The external cavity can be in, or encompass, an optically transmissive solid material, (e.g., silica, sapphire, etc.), free space (e.g., no solid material present), or both. The external cavity can be within, or defined by, a housing, which housing for example can make up, or contain, the laser assembly, a laser tool, or laser device. Thus, for example, the housing can encompass some or all of the integral optical coupler, or it can encompass some or all of both the integral optical coupler and the laser diode source.

Figure 13:
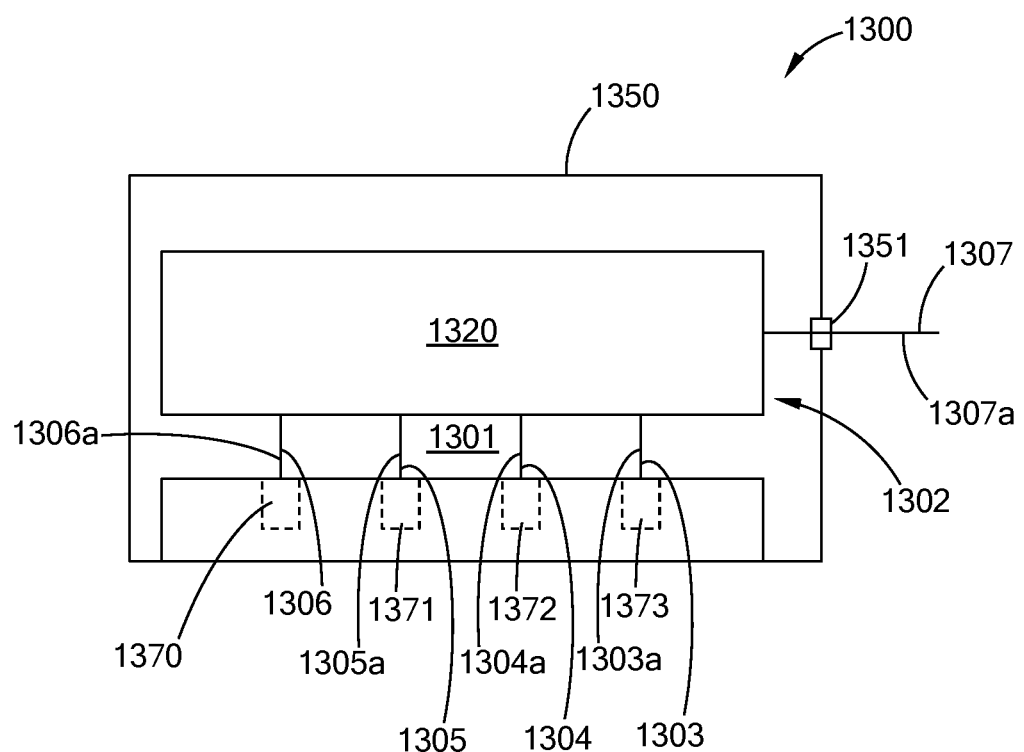
FIG. 13 is a block schematic of an embodiment of a laser system in accordance with the present inventions.

Thus, turning to FIG. 13 there is shown a block schematic diagram of an embodiment of a laser assembly 1300. The assembly 1300 has a diode array 1301, that generates laser beams 1303, 1304, 1305, 1306, along laser beam paths 1303*a*, 1304*a*, 1305*a*, 1306*a* respectively. The laser beams are generated by diodes having collimating optics in optical association with the diodes 1370, 1371, 1372, 1373. The collimating optics may be a single aspheric optic which is used to collimate the fast axis of the laser diode sources, but leaves the slow axis slightly uncollimated, or the collimating optic may consist of two optical elements, a fast acylindrical optic for collimating the fast axis of the laser diode and a slow acylindrical optic for collimating the slow axis of the laser diode. The fast acylindrical optic is typically of a short focal length and mounted near or on the diode laser itself, while the slow acylindrical optic has a sufficiently long focal length to either circularize the divergence of the laser source or to meet the acceptance angle requirements of the filters or VBGs used in the assembly. The laser beam paths extend from the diodes in the diode array 1301 to an optical assembly 1320, which for example can be the optical blocks of FIG. 3, the filter stack of FIG. 2, or the integral coupler of FIG. 1 or 1A. The optical assembly 1320 combines the laser beams into laser beam 1307 that travels along laser beam path 1307*a*. There is an external cavity 1302, which is external to the diode array 1301. The external cavity 1302 contains block 1320, and the laser beams and beam paths. The external cavity is encompassed by a housing 1350 which has a window for the transmission of laser beam 1307 along beam path 1307*a*.

The diode laser can be any type of diode laser and would include small semiconductor lasers, as well as, interband cascade lasers (ICLs); quantum cascade lasers (QCLs).

Figure 2:
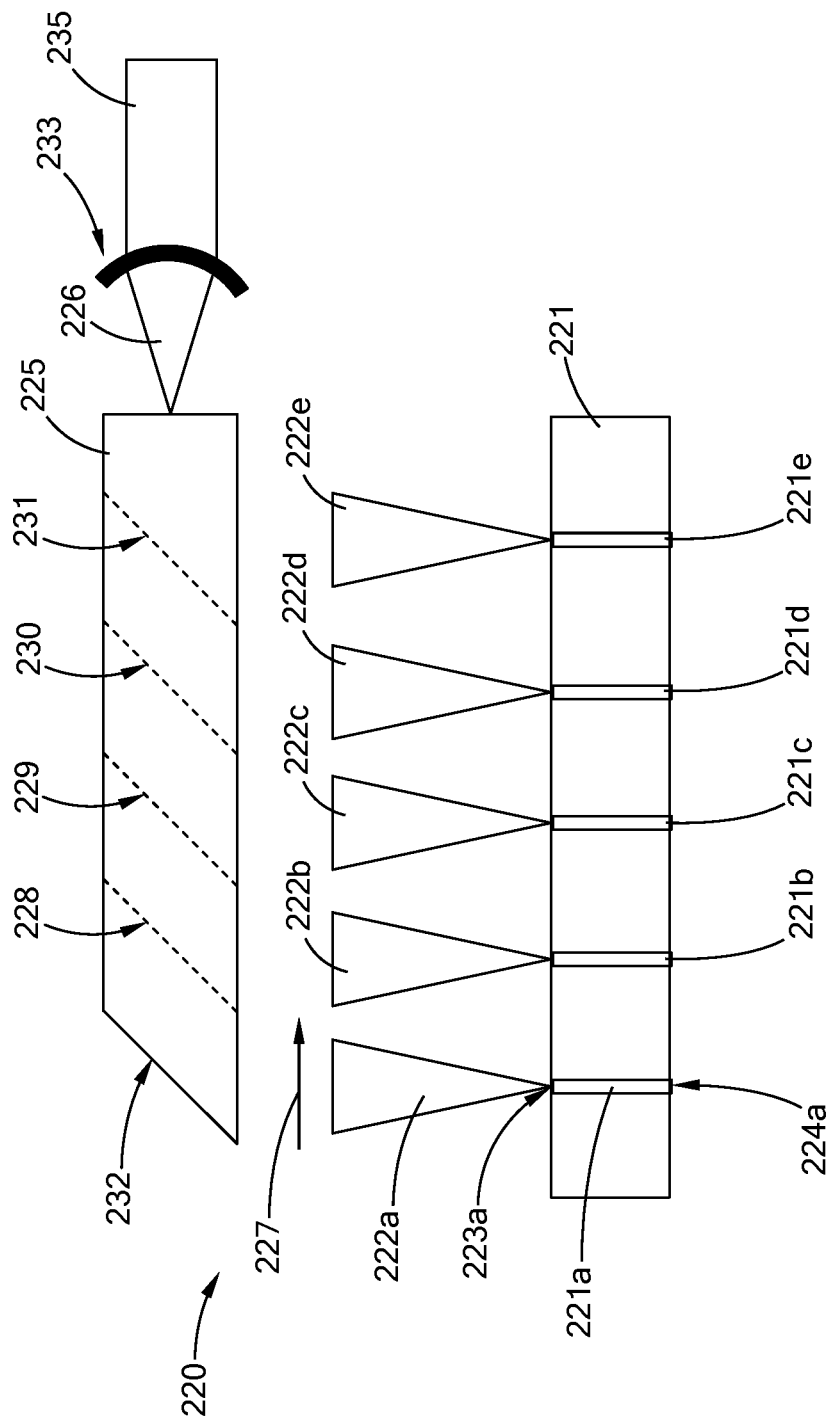
FIG. 2 is a schematic of an embodiment of an external cavity laser system in accordance with the present inventions with the output coupler external to the combiner.

In the embodiments of FIGS. 1 and 1A the optical coupler is integral with the stack of filters. In the embodiment of FIG. 2 the optical coupler is separate from the stack of filters.

Turning to FIG. 2 there is shown beam combining assembly 220. The assembly 220 has a laser diode source 201, (preferably providing laser beams collimated in the slow axis, the fast axis or both) e.g., an array of laser diodes, a laser diode bar, or a collection of individual chips. The laser diode source has individual laser diodes 221*a*, 221*b*, 221*c*, 221*d*, 221*e*. The laser diode source 221 provides laser beams, 222*a*, 222*b*, 222*c*, 222*d*, 222*e*, which travel along laser beam paths that are coincident with the laser beams. The laser beams have a direction of polarization as shown by arrow 227. The laser diodes, e.g., 221*a*, each have a surface or face, e.g., 223*a*, having an AR (anti-reflection) coating. The laser diodes, e.g., 221*a*, each have a surface or face, e.g., 224*a*, having an HR (high-reflection) coating. The laser beams, e.g., 222*a*, travel along their beam paths to a filter stack 225. The filter stack 225 has a TIR (total internal reflation) surface, 232, such that the laser beam 222*a* is directed along the length of the stack and combined with laser beams 222*b*, 222*b*, 222*c*, 222*d*, and 222*e*, which are directed and filtered by wavelength specific filters 228, 229, 230, 231, to provide laser beam 226. Each filter has a different wavelength, and preferably a unique wavelength for the others, and can be for example bandpass, high bandpass, low bandpass and combinations of these, filters. Laser beam 226 travels along its laser beam path to an output coupler 233 (R≤∞) that is external to the stack 225, and provides feedback to the laser sources as defined by the round trip optical path from the laser diodes (221*a,b,c,d,e*) through the combiner assembly (220), to the mirror (223) and back through the combiner assembly (220) and finally back to the laser diodes (221*a,b,c,d,e*) and which provides laser beam 235.

Figure 3:
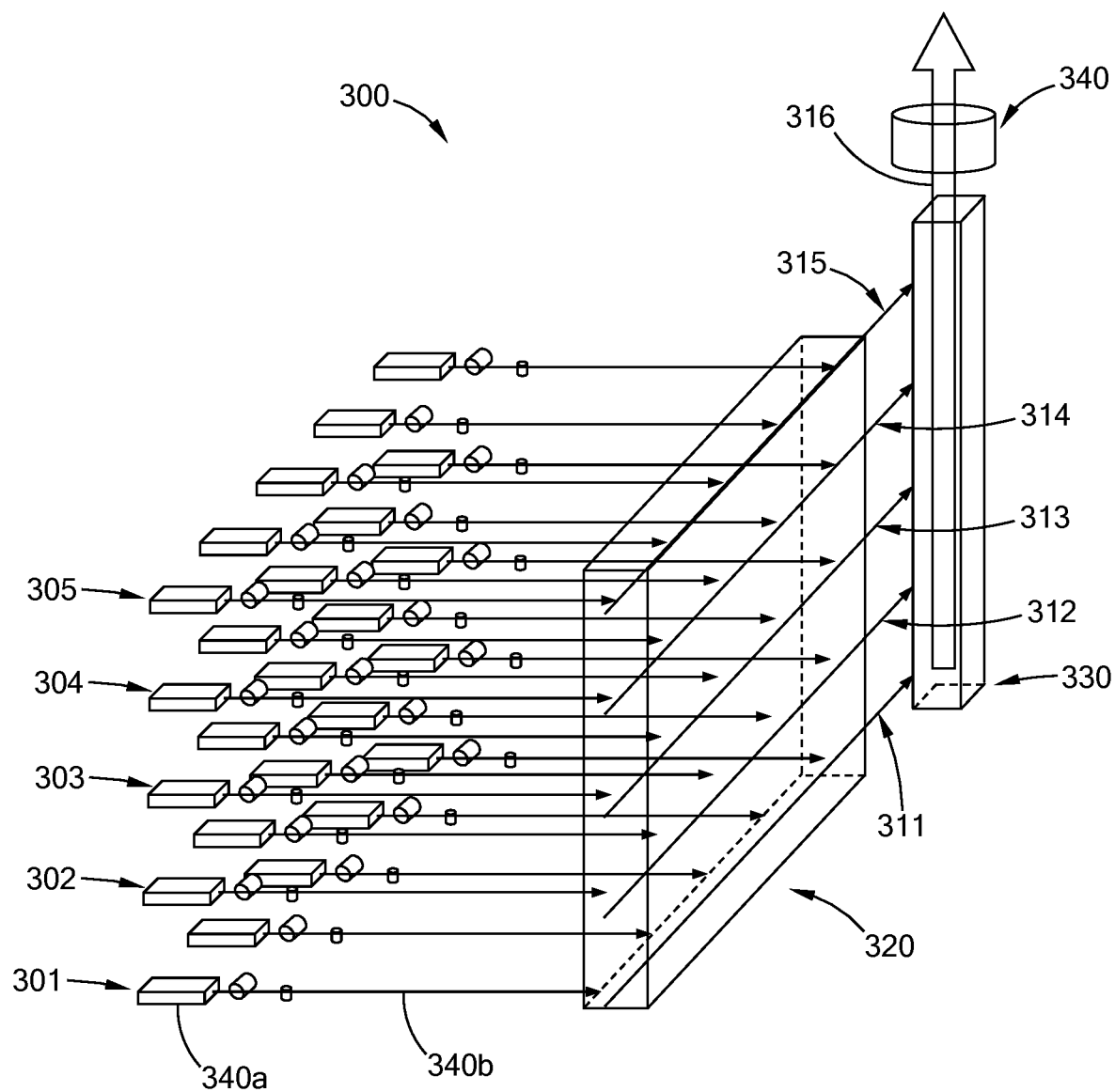
FIG. 3 is a schematic of an embodiment of an external cavity laser system in accordance with the present inventions, extended to lock up laser diodes in a two dimensional array.

Additionally, spectral beam combining can take place simultaneously in the fast and slow axis within the external cavity as shown in FIG. 3 over a broader bandwidth range. Thus, there is a laser assembly 300 that a configuration of five rows 301, 302, 303, 304, 305 of laser diodes, which each row having five laser diodes, e.g., 340*a*, which generate individual laser beams, e.g., 340*b*. The laser beams travel along laser beam paths to a first optical block 320 where the laser beams from each row are combined into single beams 311, 312, 313, 314, 315. The combined laser beams travel along laser beam paths to a second optical block 330 where they are combined into a single laser beam 316, which travels along a laser beam path to optic 340 (which can be either a broadband mirror with the appropriate reflectivity (>30-40%) or a wavelength selective device such as a narrow band mirror) The transmission function for a row may be 3-nm wide, but the overall gain capability of the laser diode is 20 nm, allowing up to 6 rows to be combined for an additional increase in the brightness of the laser system. This cavity transmission function is illustrated in greater detail in FIG. 10.

Figure 4:
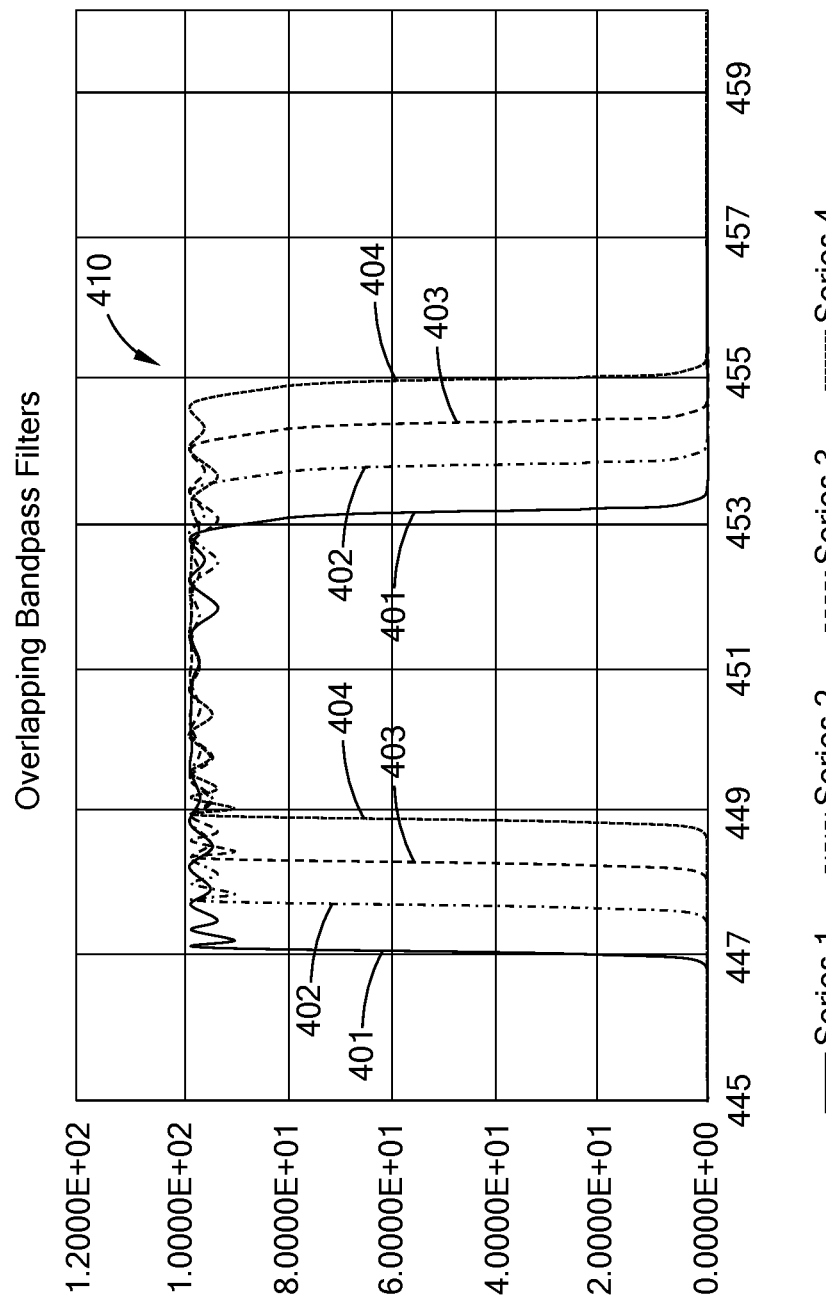
FIG. 4 is a graph showing the relationship between each of the transmission functions of an embodiment of a bandpass filter used in accordance with the present inventions.

Turning to FIG. 4 there is shown an embodiment of the transmission functions for four bandpass filters that are used in the combiner block to define the composite transmission function for the spectral beam combining cavity with the last reflector being a total internal reflecting surface. The four bandpass filters are shown by transmission functions 401, 402, 403, 404, (Series1, Series2, Series3, Series4 respectively) which are combined to provide combined function 410. In FIGS. 4-8 the y-axis is in percent transmission and the x-axis is wavelength in nm.

Figure 5:
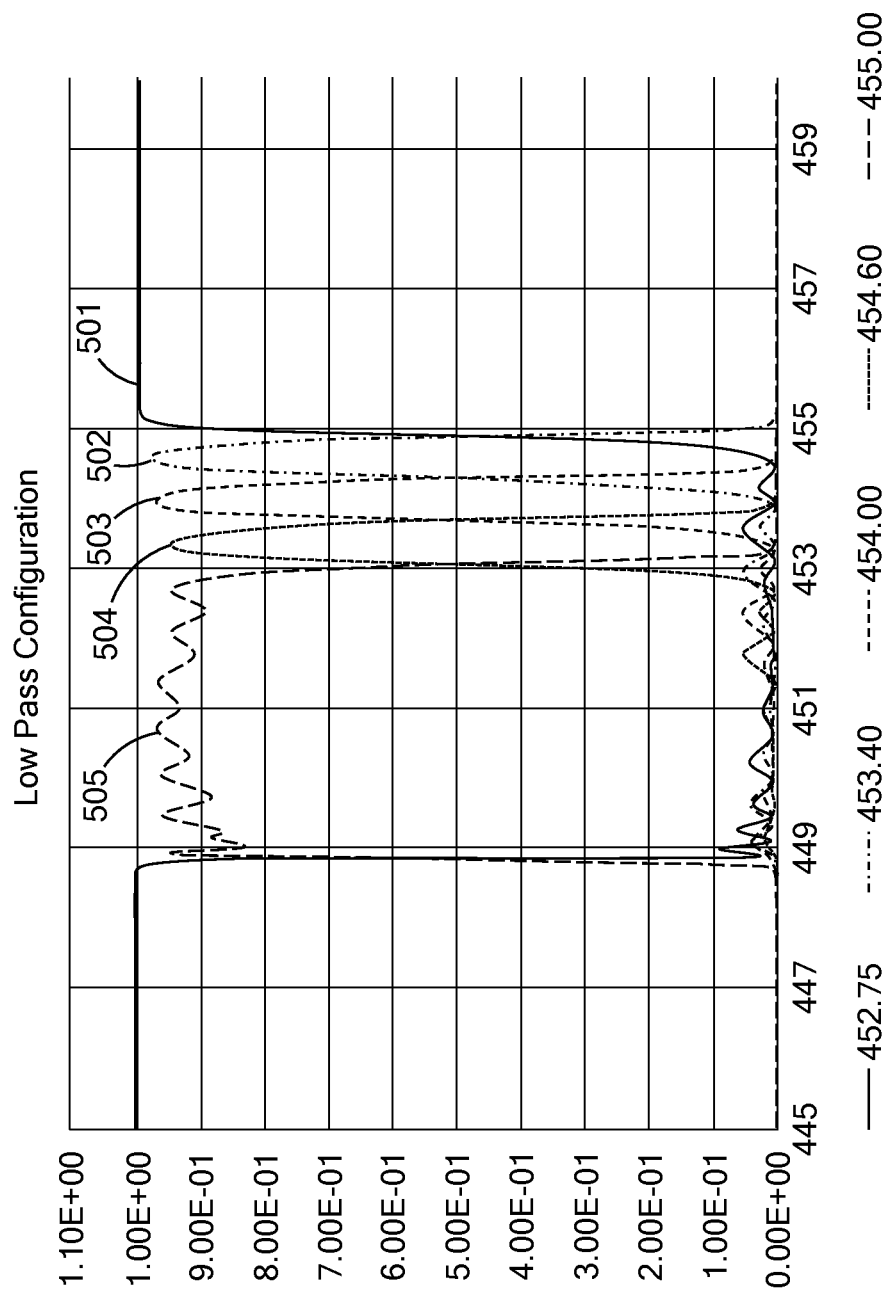
FIG. 5 is the transmission function for an embodiment of a combiner block showing the maximum transmission peaks for each of the laser diodes which will have the lowest loss in the external cavity resulting in the passive locking of each laser diode to the appropriate transmission peak when using the high wavelength side of the bandpass transmission functions in accordance with the present inventions.
Figure 6:
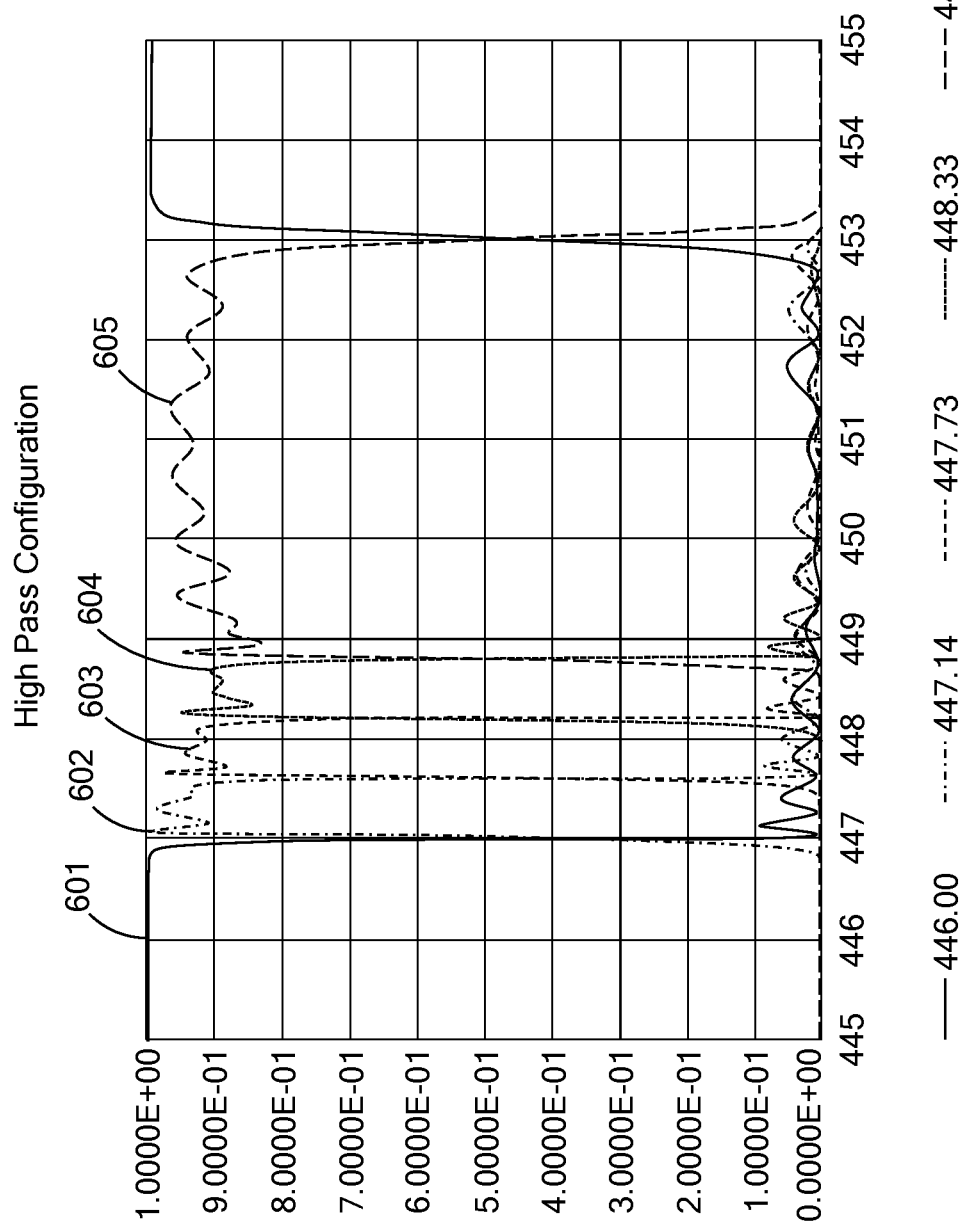
FIG. 6 is the transmission function for an embodiment of a combiner block based when using the low wavelength side of the bandpass transmission functions in accordance with the present inventions.

The overlapping composite transmission function for each of the laser diodes in the external cavity is shown in FIG. 5 and FIG. 6 for highly collimated laser sources with collimation on the order of 1 mrad or less. FIG. 5 is a low pass configuration for the case of using the long wavelength edge of the transmission functions to create the passbands for each of the laser diode sources. With line 505 for 452.75 nm, line 504 for 453.40 nm, line 503 for 454.00 nm, line 502 for 454.60 nm, and line 501 for 455.00 nm. The round trip transmission spectrums for the beam combiner can best be explained using FIG. 1. The round trip transmission function for the first line 505 is broad because it is the product of the broadband reflection characteristics of the TIR surface shown as 112 in FIG. 1 and the transmission functions of each of the following filters (401,402,403,404). Since filters are chosen to overlap as shown in FIG. 4, the laser beams see a roundtrip transmission function that allows the light that is shorter in wavelength than the upper wavelength band edges to pass. Peak 504 is narrower than peak 505, because it is the product of the reflection characteristics of filter 108 (filter 401 (1-transmission)) and the transmission characteristics of filter 402, 403 and 404 which results in a pass band that is only 0.75 nm wide and is at 453.4 nm. Peak 503 is the product of the reflection characteristics of filter 109 (filter 402) and the transmission characteristics of filters 403 and 404. This results in a passband that is 0.75 nm wide at 454 nm. Peak 503 is the product of the reflection characteristics of filter 110 (filter 403) and the transmission characteristics of filter 404. This is the passband at 454.6. Peak 502 is the reflection characteristics of filter 111 (filter 404) and the bandwidth is defined by the bandwidth of the output coupler. The tighter the reflection bandwidth of the output coupler the narrower peaks 505 and 501 will be. This wavelength peaks for 505 and 501 assume that the output coupler is a band reflection filter that is 2.25 nm wide. FIG. 6 is a high pass configuration for the case of using the short wavelength edge of the transmission functions to create a sequence of passbands for each of the laser diodes in the external cavity. With line 601 for 446.00 nm, line 602 for 447.14 nm, line 603 for 447.73 nm, line 604 for 448.33 nm, and line 604 for 448.94 nm. Each of the combiner filters are arranged at a 45-degree angle within 10 micro-radians resulting in each of the laser diode beams overlapping to form a single laser beam with Nx the brightness of the original laser diode. The resulting transmission functions determines the wavelength, bandwidth and spatial brightness of the laser diodes. The transmission functions are calculated the same way as above but now using the shorter wavelength edge of the filters and allowing the longer wavelengths of light to pass. Again, 601 and 605 bandwidths are limited by a narrowband output coupler that is only 2.25 nm wide. The 10 micro-radian alignment is a small deviation from the 1 mrad divergence of the composite beam making the beam 1.05 mrad in either axis or an $M^2$ value of 1.1.

Figure 7:
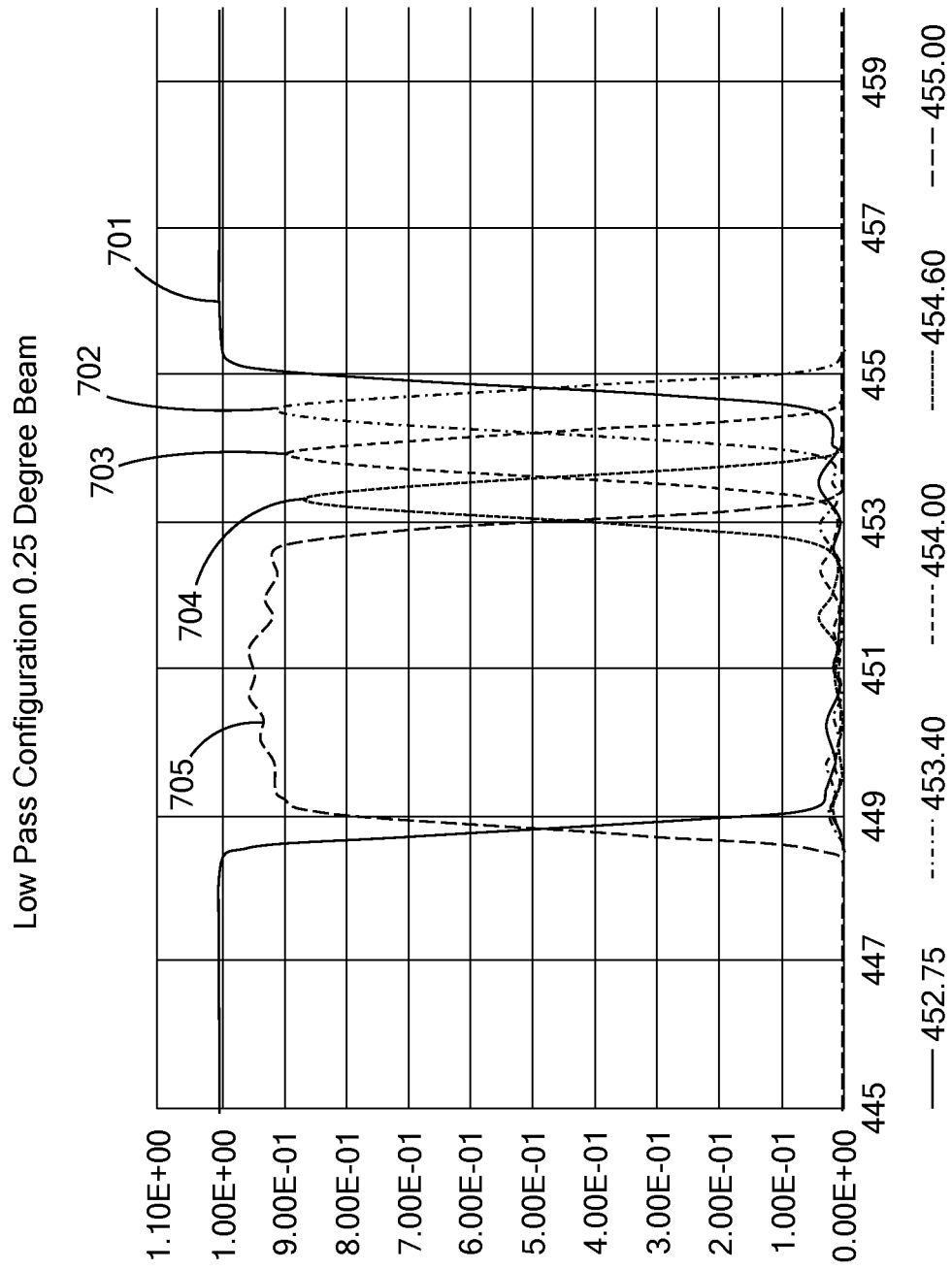
FIG. 7 is the transmission function for an embodiment of a laser diode beam combiner block based on a beam divergence of 0.25 degrees from the laser diodes using the high wavelength edge of the bandpass filter transmission function in accordance with the present inventions.
Figure 8:
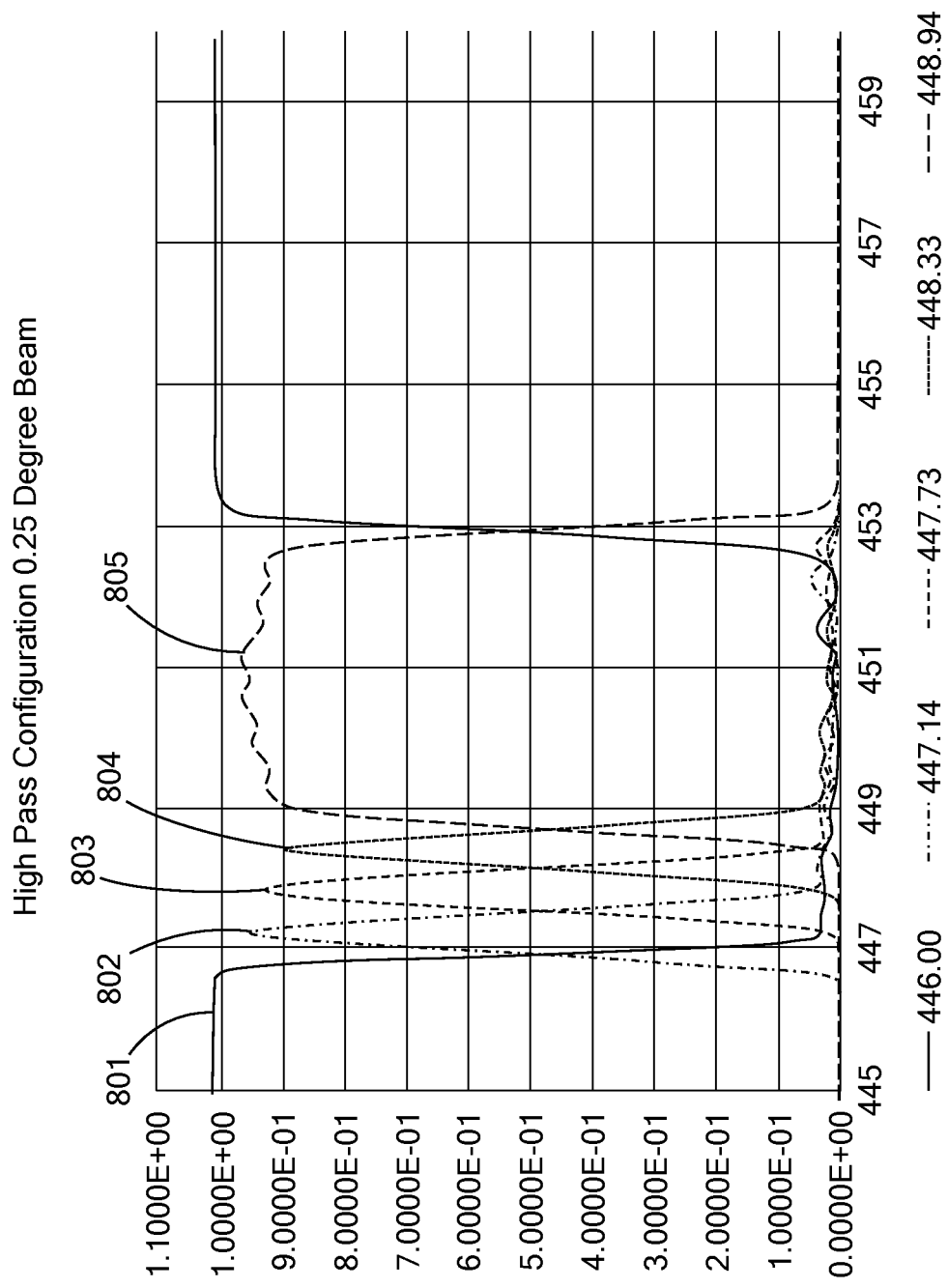
FIG. 8 is transmission function for an embodiment of a combiner block using the lower wavelength edge of the bandpass filter transmission function for diverging laser diode light in accordance with the present inventions.

FIGS. 5 and 6 correspond to using single mode laser diodes sources, which beams to be formed with $M^2$ values approach 1. However multi-mode laser diodes have a higher divergence in the slow axis, which can be on the order of 0.25 degrees or less, resulting in a different transmission function for the filters at the higher divergence angles. FIG. 7 and FIG. 8 shows the composite transmission functions for the external cavity combiner when using the broader transmission functions for a laser source that has a divergence of 0.25 degrees. The filters have all been designed to provide a 10-dB decrease in the transmission function at their overlapping points, which is sufficient to suppress the parasitic lasing outside of the passband regions. In FIG. 7 line 705 is for 452.75 nm, line 704 is for 453.40 nm, line 703 is for 454.00, line 702 is for 454.60 and line 701 is for 455.00. In FIG. 8, line 801 is for 446.00 nm, line 802 is for 447.14 nm, line 803 is for 447.73 nm, line 804 is for 448.33 nm, line 805 is for 448.94 nm. Similar to the explanation above for FIG. 5, the outer bands are defined by the output coupler used, so for FIG. 7 an output coupler that is 2.25 nm wide will define the bandwidth of line 705 and 701. Line 705 is product of the reflection curve for the TIR surface and filters 401, 402, 403, 404. Line 704 is the product of the reflection curve for filter 401 (1-Transmission) and the transmission functions for filter 402, 403 and 404. Line 703 is the product of the reflection curve for filter 402 and the transmission functions for filters 403 and 404. Line 702 is the product of the reflection curve for filter 403 and the transmission function for filter 404. Line 701 is the product of the reflection curve for filter 404 and the transmission function of the output coupler which is not shown in FIG. 4. In FIG. 8 the shorter wavelength edges are used and similar to the explanation above for FIG. 6, the outer bands are defined by the output coupler used, so for FIG. 8 an output coupler that is 2.25 nm wide will define the bandwidth of line 805 and 801. Line 805 is product of the reflection curve for the TIR surface and filters 401, 402, 403, 404. Line 804 is the product of the reflection curve for filter 404 (1-Transmission) and the transmission functions for filter 401, 402 and 403. Line 803 is the product of the reflection curve for filter 403 and the transmission functions for filters 401 and 402. Line 802 is the product of the reflection curve for filter 402 and the transmission function for filter 401. Line 801 is the product of the reflection curve for filter 401 and the transmission function of the output coupler which is not shown in FIG. 4.

Turning now to a further detailed discussion of embodiments of the present invention. As shown in FIGS. 1 and 1A, two or more laser diodes have high reflective coatings on the back side of the laser diode facets and anti-reflection coatings on the front side of the laser diode facets. Optics are used to collimate the light in the fast and slow axis of the laser diodes. Once the laser diode light is collimated, a series of optical coatings or volume Bragg gratings (spectral beam combiners) deflect the light at an angle up to 90° with respect to the light emission direction. The optical coatings or volume Bragg gratings are placed such that the light emitting from each laser diode is spatially overlapped in the near field and far field simultaneously. The design of the optical coatings or volume Bragg gratings results in a passband through the system that determines the lowest loss path for the external cavity and by definition this results in defining the wavelength each of the laser diodes will oscillate on as well as the bandwidth of each individual laser diode. Each group of central wavelengths and corresponding optical bandwidths are mutually exclusive in the optical spectrum. The external laser cavity is formed by an output coupler mirror, a bandwidth-limiting reflective optical coating or volume Bragg grating, of which the bandwidth-limiting optical coating or volume Bragg grating defines the total optical bandwidth of the external laser cavity. As shown in FIG. 1, the output coupler mirror, bandwidth-limiting laser cavity output optical coating or volume Bragg grating can be on the surface/sub-surface of the monolithic optic containing the individual optical coatings or volume Bragg gratings. FIG. 2 is identical to FIG. 1 except that the output coupler mirror, bandwidth-limiting laser cavity output optical coating or volume Bragg grating are a separate optic.

The laser cavity can include one or two spectral beam combiners. In the case of two spectral beam combiners, each specific spectral beam combiner operates on either the fast or slow axis of the laser diode light, and both of the spectral beam combiners must operate on the orthogonal axis (with respect to the laser diode emission facet) to each other. The separate spectral beam combiners operate in serial fashion, such that spectral beam combining is performed on one axis first, and then on the orthogonal axis afterwards.

The output of the external cavity exhibits a brightness enhancement of N compared to a single laser diode, where N is the number of laser diodes in the external laser cavity.

Each individual laser diode will lase at the wavelength of lowest loss within the transmission function of the composite optic due to the optical feedback within the external laser cavity, so long as the gain bandwidth of the individual laser diode falls within the transmission function of the composite optical combiner due to the optical feedback within the external laser cavity.

The oscillating bandwidth of the external cavity laser can be modified or changed with different types of filters in the external cavity to control the losses of the cavity such that only the lowest loss wavelength bands oscillate.

The design of the optical coatings or volume Bragg gratings (bandpass filters) for a single axis spectrally beam combined external cavity is shown in FIG. 4. The external laser cavity can be arranged to operate in the low-pass configuration, as shown in FIG. 5, or the high-pass configuration, as shown in FIG. 6. Both FIG. 5 and FIG. 6 show the filter transmission function for the fast axis of the laser diode light or for diode lasers that are single mode in both axes. The case of a multimode laser diode with a modest divergence of 0.25 degrees, FIG. 7 shows the transmission functions for the low-pass configuration, and FIG. 8 show the high-pass configuration. Here the transmission losses are slightly higher due to the divergence angle of the multimode laser diodes. There are many different combinations of beam divergences that can be combined, the combiner block is generally configured in terms of free aperture size and channel spacing depending on the divergence of the source and the type of source being used, e.g., Individual laser diodes or a laser diode bar.

Figure 9:
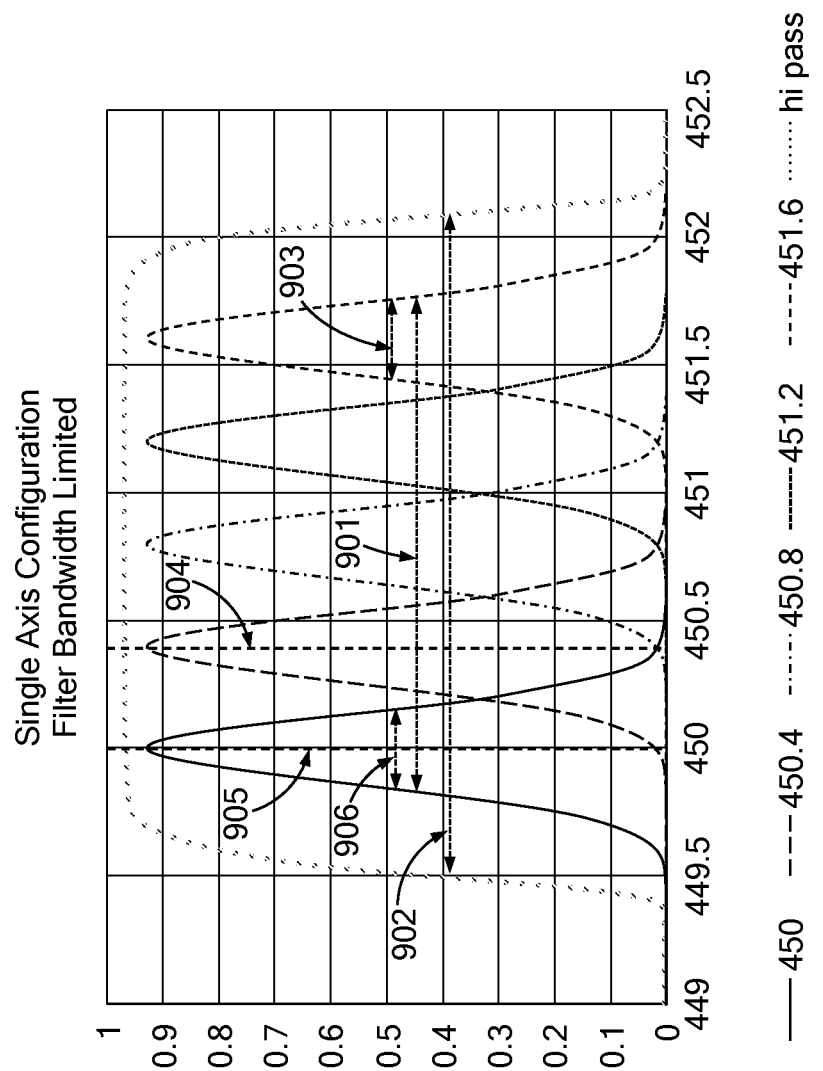
FIG. 9 is a graph showing the overlap of an embodiment of a combiner block transmission function and the feedback from an embodiment of an external cavity bandpass transmission filter function in accordance with the present inventions, which defines the oscillating bandwidth for the laser diode array.

FIG. 9 shows an example where the individual bandpass filters of for example the embodiment of FIG. 4 are designed to overlap such that the product of their transmission functions create a comb filter type function where $\Sigma\Delta\lambda_{BPF} \leq \Delta\lambda_{OC}$, where $\Sigma\Delta\lambda_{BPF}$ (901) is the product of the transmission functions of the optical coatings or volume Bragg gratings, and $\Delta\lambda_{OC}$ (902) is the bandwidth of the output coupler. Defining N as the number of individual laser diode emitters, the bandwidth of each individual bandpass filter is defined such that $\Delta\lambda_{BPF} \approx \Delta\lambda_{OC}/N$ (903). For a central wavelength of $\lambda_C$, $\lambda_C^N(\Delta\lambda_{BPF}^N) - \lambda_C^{N-1}(\Delta\lambda_{BPF}^{N-1}) \geq \Delta\lambda_{BPF}^{N-1}$, where $\lambda_C^N(\Delta\lambda_{BPF}^N)$ is the central wavelength of bandpass filter N (904), $\lambda_C^{N-1}(\Delta\lambda_{BPF}^{N-1})$ is the central wavelength of bandpass filter N−1 (905), and $\Delta\lambda_{BPF}^{N-1}$ is the bandwidth of bandpass filter N−1 (906). Additionally, $\lambda_C^{N-1}(\Delta\lambda_{BPF}^{N-1}) - \lambda_C^{N-2}(\Delta\lambda_{BPF}^{N-2}) \geq \Delta\lambda_{BPF}^{N-2}$, and so on also hold to ensure unique lasing wavelengths for each individual laser diode.

Figure 10:
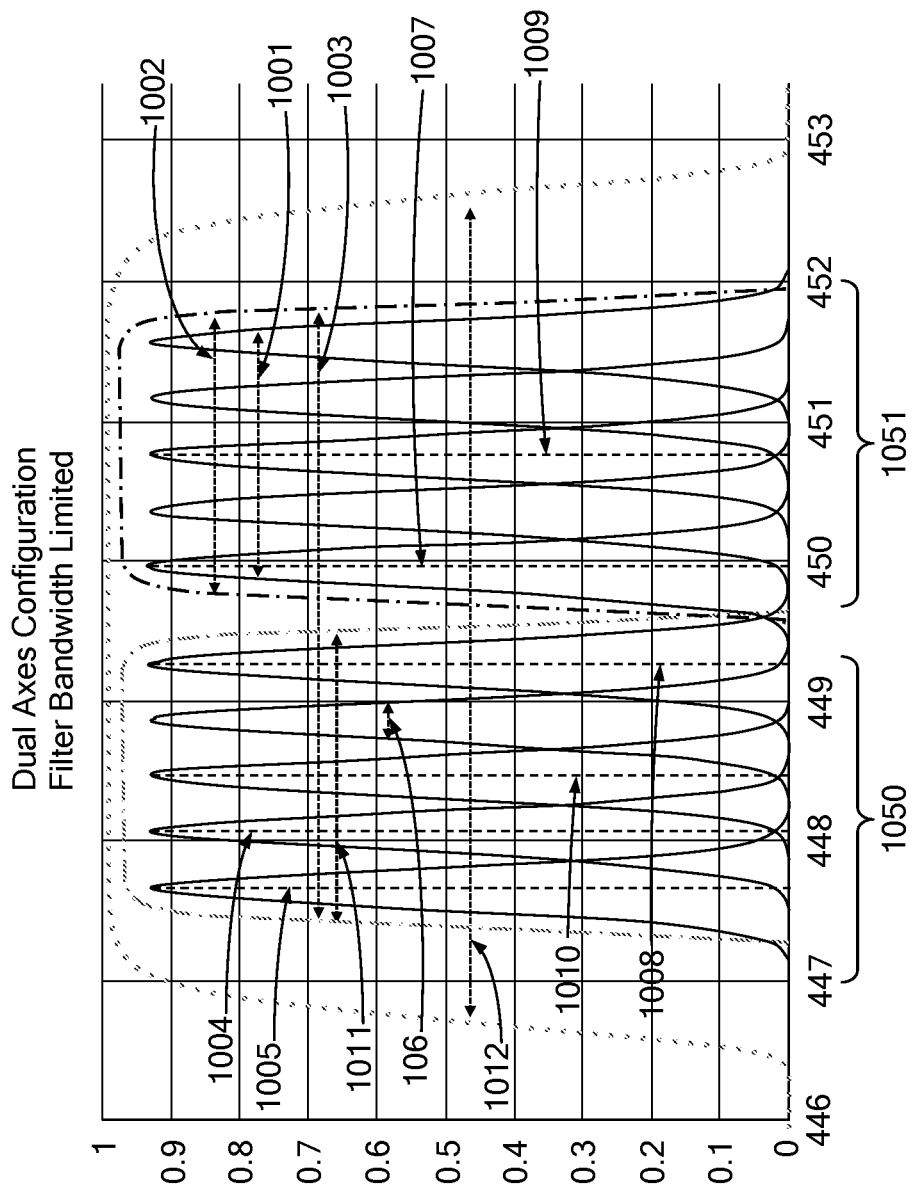
FIG. 10 is a graph showing the overlap of an embodiment of a combiner block transmission function from one row and an embodiment of a combiner block transmission function used in a second row that is the wider of the bandpass transmission functions allowing feedback to laser diodes in two axes in accordance with the present inventions.

The single-axis spectrally beam combined external cavity with four laser diodes can be extended to spectral beam combination in both axes as shown in FIG. 3 by overlapping the transmission functions of one axis with the transmission functions of a perpendicular axis as shown in FIG. 10. In this example, the light out of the individual laser diodes is collected in the fast and slow axis by separate optics. Each row X of laser diodes are then spectrally beam combined in the fast axis by a beam combiner similar in construction to FIG. 1 but with a broader comb filter function than the individual rows (e.g., 1050 in FIG. 10 corresponds to Row 301 of FIGS. 3; and 1051 of FIG. 10 corresponds to Row 302 of FIG. 3). Similar to the previous case, individual bandpass filters for the slow axis are designed to spectral bandwidths such that the product of their transmission functions is $\Sigma\Delta\lambda_{BPF,S}{}^X \approx \Delta\lambda_{BPF,F}{}^X$ where $\Sigma\Delta\lambda_{BPF,S}{}^X$ (1001) is the product of the transmission functions of the bandpass filters for row X, and $\Delta\lambda_{BPF,F}{}^X$ (1002) is the bandwidth of the following bandpass filter in the fast axis corresponding to the laser diodes spectrally combined in row X. To combine X rows in the fast axis, the criteria follows that $\Delta\lambda_{BPF,F}{}^X \approx \Delta\lambda_{OC}/X$ and $\Sigma\Delta\lambda_{BPF,F} \le \Delta\lambda_{OC}$, where $\Sigma\Delta\lambda_{BPF,F}$ (1003) is the product of the transmission functions for the fast axis bandpass filters. To ensure a unique lasing wavelength for each individual laser diode, consider M individual laser diodes in each row X and the additional restrictions follow such that $\lambda_C{}^{S*M}(\Delta\lambda_{BPF,S}{}^{X*M}) - \lambda_C{}^{X*M-1}(\Delta\lambda_{BPF,S}{}^{X*M-1}) \ge \Delta\lambda_{BPF,S}{}^{X*(M-1)}$, where $\lambda_C{}^{X*M}(\Delta\lambda_{BPF,S}{}^{X*M})$ (1004) is the central wavelength of laser diode M in row X, $\lambda_C{}^{X*M-1}(\Delta\lambda_{BPF,S}{}^{X*M-1})$ (1005) is the central wavelength of laser diode M−1 in row X, and $\Delta\lambda_{BPF,S}{}^{X*M-1}$ (1006) is the bandwidth of the comb filter defined by the adjacent bandpass filters for laser diode M−1 in row X. It also holds that $\lambda_C{}^{X*M-1}(\Delta\lambda_{BPF,S}{}^{X*M-1}) - \lambda_C{}^{X*M-2}(\Delta\lambda_{BPF,S}{}^{X*M-2}) \ge \Delta\lambda_{BPF,S}{}^{X*M-2}$ and so on; $\lambda_C{}^{X*M-(M-1)}(\Delta\lambda_{BPF,S}{}^{X*M-(M-1)}) > \lambda_C{}^{(X-1)*M}(\Delta\lambda_{BPF,S}{}^{(X-1)*M})$, $\lambda_C{}^{(X-1)*M-(M-1)}(\Delta\lambda_{BPF,S}{}^{(X-1)*M-(M-1)}) > \lambda_C{}^{(X-2)*M}(\Delta\lambda_{BPF,S}{}^{(X-2)*M})$ and so on must also hold, where $\lambda_C{}^{X*M-(M-1)}(\Delta\lambda_{BPF,S}{}^{X*M-(M-1)})$ is the central wavelength of the lowest wavelength bandpass filter in row X (1007) and $\lambda_C{}^{(X-1)*M}(\Delta\lambda_{BPF,S}{}^{(X-1)*M})$ is the central wavelength of the highest wavelength bandpass filter in row X−1 (1008). Additionally, $\lambda_C(\Delta\lambda_{BPF,F}{}^X) - \lambda_C(\Delta\lambda_{BPF,F}{}^{X-1}) \ge \Delta\lambda_{BPF,F}{}^{X-1}$, where $\lambda_C(\Delta\lambda_{BPF,F}{}^X)$ (1009) is the central wavelength of the fast axis bandpass filter for row X, $\lambda_C(\Delta\lambda_{BPF,F}{}^{X-1})$ (1010) is the central wavelength of the fast axis bandpass filter for row X−1, and $\Delta\lambda_{BPF,F}{}^{X-1}$ (1011) is the bandwidth of the fast axis bandpass filter for row X−1. It also holds that $\lambda_C(\Delta\lambda_{BPF,F}{}^{X-1}) - \lambda_C(\Delta\lambda_{BPF,F}{}^{X-2}) \ge \Delta\lambda_{BPF,F}{}^{X-2}$ and so on. Finally, $\Sigma\Delta\lambda_{BPF,F} \approx \Delta\lambda_{OC}$, where $\Delta\lambda_{OC}$ (1012) is the bandwidth of the output coupler to the external laser cavity. Another iteration of this design is such that the fast axis is spectrally beam combined first, followed by spectral beam combination of the slow axis.

For the case where $\Sigma\Delta\lambda_{BPF} > \Delta\lambda_{OC}$, the transmission functions, in either the fast axis, slow axis, or both axes, act like edge filters when operating in an external cavity configuration with a bandwidth-limiting optical coating or volume Bragg grating acting as the external laser cavity output coupler. The restrictions for operating N individual emitters at unique wavelengths in either the fast or slow axis, or both axes simultaneously, are outlined herein.

Figure 11:
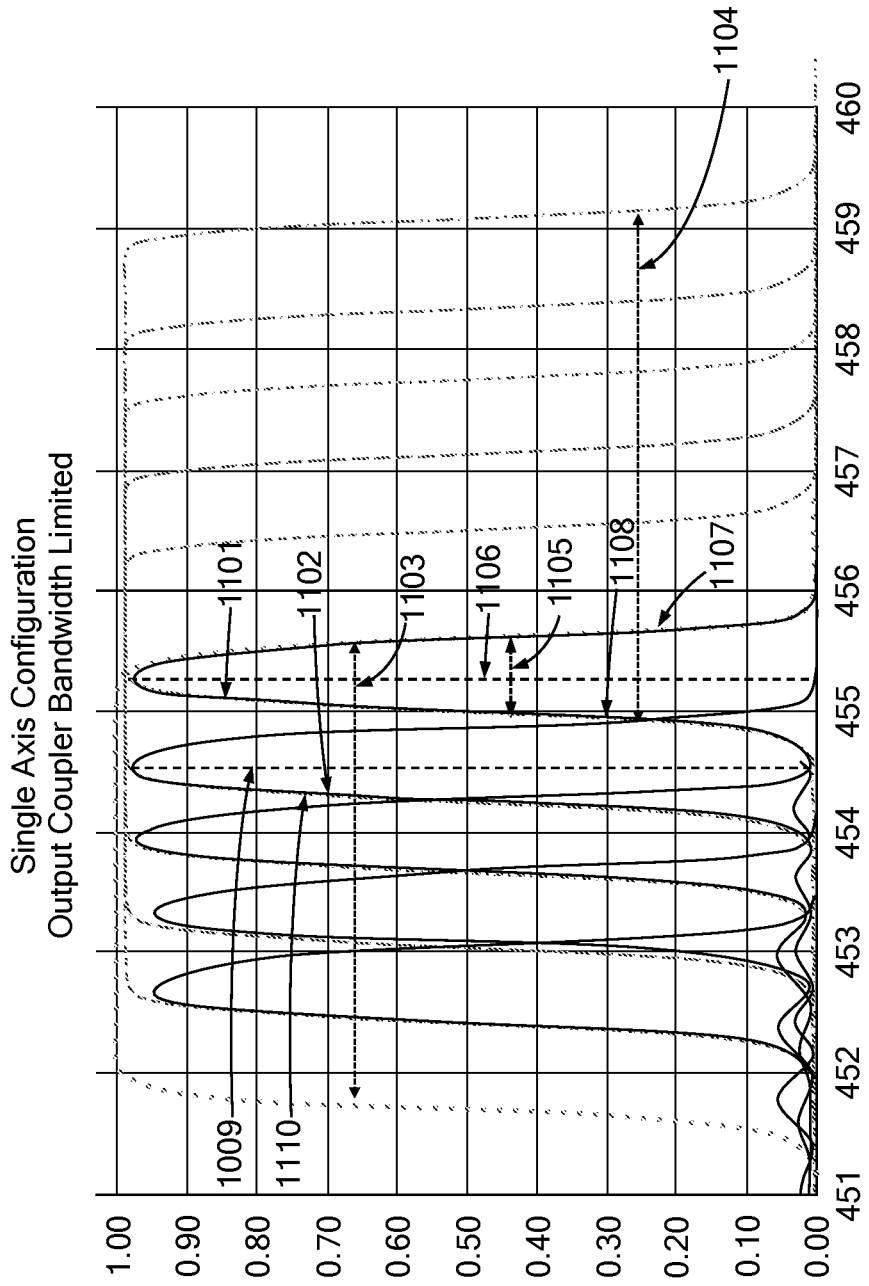
FIG. 11 is a graph showing the overlap of the response functions for an embodiment of a combiner block for the case of a broadband output coupler reflection function and how by using a narrowband output coupler reflection function the oscillating bandwidth can be reduced for one axis in accordance with the present inventions.

For a hypothetical single-axis spectrally beam combined external cavity with four laser diodes, the implementation of the bandpass filters is shown in FIG. 11. The transmission functions of the Individual bandpass filters are designed to overlap the central wavelength of the rising (or falling) edge of successive filters is $\lambda_C{}^{RE}(BPF^N) - \lambda_C{}^{RE}(BPF^{N-1}) \approx (1-1/N)*\Delta\lambda_{OC}$, where $\lambda_C{}^{RE}(BPF^N)$ (1101) is the central wavelength of the leading (or falling) edge of bandpass filter N, $\lambda_C{}^{RE}(BPF^{N-1})$ (1102) is the central wavelength of the leading (or falling) edge of bandpass filter N−1, N is the number of individual emitters in the laser diode cavity, and $\Delta\lambda_{OC}$ (1103) is the bandwidth of the output coupler. Additionally, $\Delta\lambda_{BPF}{}^N > \Delta\lambda(N)$, $\Delta\lambda_{BPF}{}^{N-1} > \Delta\lambda(N-1)$, and so on, where $\Delta\lambda_{BPF}{}^N$ (1104) is the bandwidth of the $N^{th}$ bandpass filter and $\Delta\lambda(N)$ (1105) is the bandwidth of any of the $N^{th}$ laser diode. As stated previously, the criteria of $\lambda_C{}^{RE}(BPF^N) > \lambda_C{}^{RE}(BPF^{N-1})$, $\lambda_C{}^{RE}(BPF^{N-1}) > \lambda_C{}^{RE}(BPF^{N-2})$, and so on ensures unique lasing wavelengths for each individual laser diode. In the low-pass configuration of FIG. 11, for a series of N laser diodes with $\lambda_C{}^N > \lambda_C{}^{N-1}$, $\lambda_C{}^N$ (1106) will lase between the highest wavelength edge of $\Delta\lambda_{OC}$ (1107) and the lowest wavelength edge of $\Delta\lambda_{BPF}{}^N$ (1108), $\lambda_C{}^{N-1}$ (1109) will lase between the lowest wavelength edge of $\Delta\lambda_{BPF}{}^N$ (1108) and the lowest wavelength edge of $\Delta\lambda_{BPF}{}^{N-1}$(1110), and so on.

Figure 12:
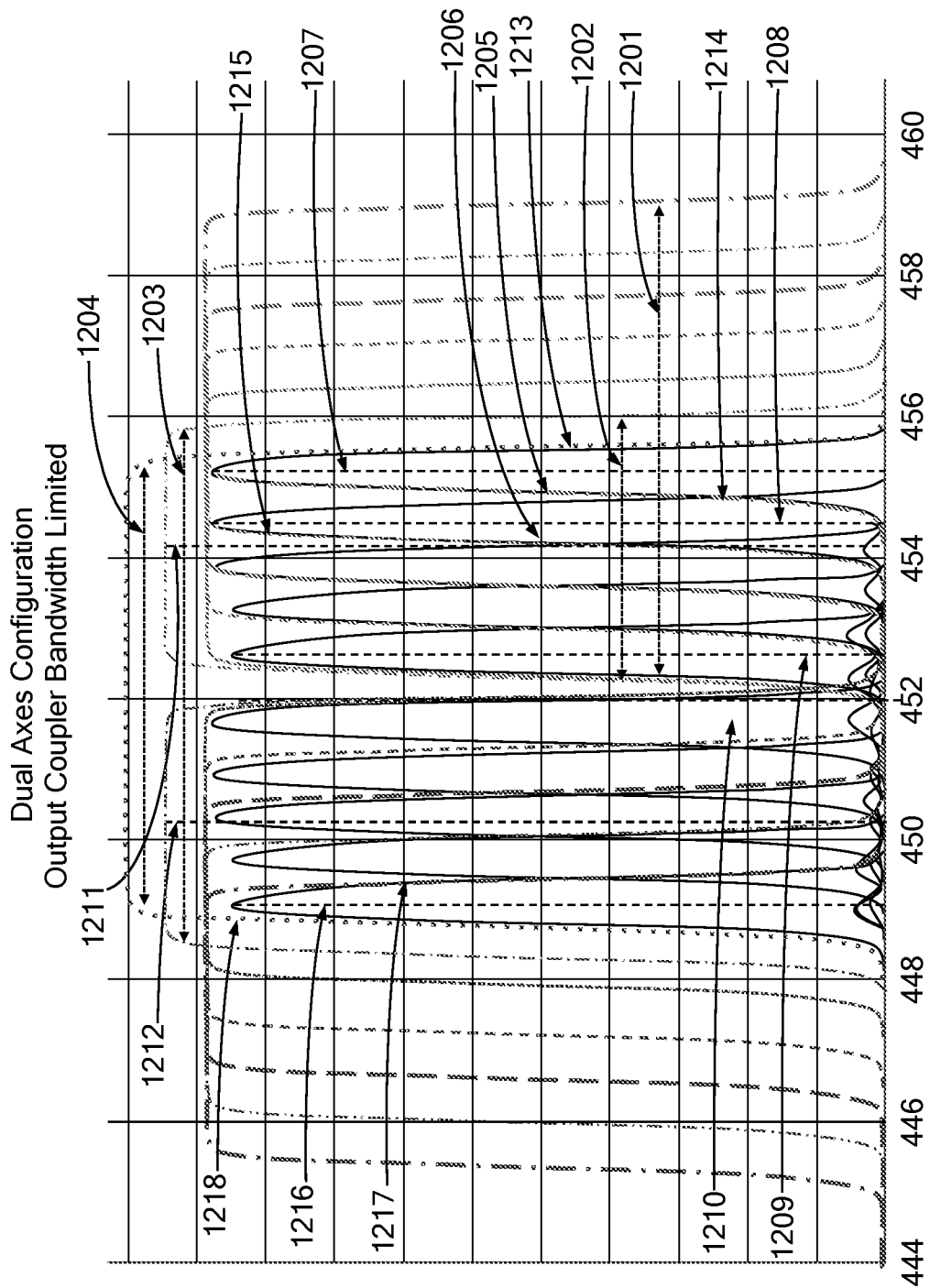
FIG. 12 is a graph showing an embodiment of a response function for the overlap of the response functions for the combiner block for the case of a broadband output coupler reflection functions and how by using narrowband output coupler reflection functions the oscillating bandwidth can be reduced for a two-axis system, as shown in FIG. 3, and in accordance with the present inventions.

The single-axis spectrally beam combined external cavity with four laser diodes (FIGS. 1 and 2) can be extended to spectral beam combination in both axes using the array configuration depicted in FIG. 3 but with broader transmission functions for the bandpass filters when combining the rows as shown in FIG. 12. In this example, the light out of the individual laser diodes is collected in the fast and slow axis by separate optics. Each row X of laser diodes is then spectrally beam combined in the fast axis by the combiner shown in FIG. 3. Similar to the previous case, individual bandpass filters for the slow axis are designed to spectral bandwidths such that the sum of their spectral bandwidths is $\Sigma\Delta\lambda_{BPF,S}{}^X > \Delta\lambda_{BPF,F}{}^X$, where $\Sigma\Delta\lambda_{BPF,S}{}^X$ (1201) is the sum of the spectral bandwidth of the bandpass filters for row X, and $\Delta\lambda_{BPF,F}{}^X$ (1202) is the bandwidth of the following bandpass filter in the fast axis corresponding to the laser diodes spectrally combined in row X. To combine X rows in the fast axis, the criteria follows that $\Delta\lambda_{BPF,F}{}^X \ge \Delta\lambda_{OC}/X$ and $\Sigma\Delta\lambda_{BPF,F} \ge \Delta\lambda_{OC}$, where $\Sigma\Delta\lambda_{BPF,F}$ (1203) is the sum of the bandwidths of the fast axis bandpass filters and $\Delta\lambda_{OC}$ (1204) is the bandwidth of the output coupler. To ensure a unique lasing wavelength for each individual laser diode, consider M individual laser diodes in each row X and the additional restrictions follow such that $\lambda_C{}^{RE}(\Delta\lambda_{BPF,S}{}^{X*M}) > \lambda_C{}^{RE}(\Delta\lambda_{BPF,S}{}^{X*M-1})$, $\lambda_C{}^{RE}((\Delta\lambda_{BPF,S}{}^{X*M-1}) > \lambda_C{}^{RE}(\Delta\lambda_{BPF,X}{}^{X*M-2})$ and so on, where $\lambda_C{}^{RE}(\Delta\lambda_{BPF,S}{}^{X*M})$ (1205) is the central wavelength of the rising edge of the slow axis bandpass filter M in row X, $\lambda_C{}^{RE}(\Delta\lambda_{BPF,S}{}^{X*M-1})$ (1206) is the central wavelength of the rising edge of the slow axis bandpass filter M−1 in row X, and so on. It also holds that $\lambda_C(X*M) > \lambda_C(X*M-1) > \lambda_C(X*M-2)$ and so on, where $\lambda_C(X*M)$ (1207) is the central wavelength for laser diode X*M, $\lambda_C(X*M-1)$ (1208) is the central wavelength for laser diode X*M−1, and so on. Additional criteria defines $\lambda_C(X*M-(M-1)) > \lambda_C((X-1)*M)$, $\lambda_C((X-1)*M-(M-1)) > \lambda_C((X-2)*M)$ and so on must also hold, where $\lambda_C(X*M-(M-1))$ is the central wavelength of the lowest wavelength laser diode in row X (1209) and $\lambda_C((X-1)*M)$ is the central wavelength of the highest wavelength laser diode in row X−1 (1210).

Additionally, $\lambda_C(\Delta\lambda_{BPF,F}{}^X) > \lambda_C(\Delta\lambda_{BPF,F}{}^{X-1}) > \lambda_C(\Delta\lambda_{BPF,F}{}^{X-2})$ and so on, where $\lambda_C(\Delta\lambda_{BPF,F}{}^X)$ (1211) is the central wavelength of the fast axis bandpass filter for row X, $\lambda_C(\Delta\lambda_{BPF,F}{}^{Z-1})$ (1212) is the central wavelength of the fast axis bandpass filter for row X−1. Finally, $\Sigma\Delta\lambda_{BPF,F} \ge \Delta\lambda_{OC}$, where $\Delta\lambda_{OC}$ (1204) is the bandwidth of the output coupler to the external laser cavity. As shown in FIG. 12, for a series of X*M laser diodes with $\lambda_C(X*M) > \lambda_C(X*M-1)$, $\lambda_C(X*M)$ (1207) will lase between the highest wavelength edge of $\Delta\lambda_{OC}$ (1213) and the lowest wavelength edge of $\Delta\lambda_{BPF,S}{}^{X*M}$ (1214), $\lambda_C(X*M-1)$ (1208) will lase between the lowest wavelength edge of $\Delta\lambda_{BPF,S}{}^{X*M}$ (1214) and the lowest wavelength edge of $\Delta\lambda_{BPF,S}{}^{X*M-1}$ (1215), and so on. The final parameter is that $\lambda_C(1)$ (1216) will lase between the highest wavelength edge of $\Delta\lambda_{BPF,S}{}^1$ (1217) and the lowest wavelength edge of the output coupler (1218). Another iteration of this design is such that the fast axis is spectrally beam combined first, followed by spectral beam combination of the slow axis.

In embodiments the brightness of the combined laser beam, e.g., 1307, where brightness is defined as the combined power divided by the aperture-divergence product, is n-times ("n" x) brighter than any single diode used in the collection of diodes for the laser assembly, e.g., the diode array, an array of laser diodes, a laser diode bar, or a collection of individual chips. Thus, the combined beam can be about 1.5×, about 10×, about 25×, about 50×, about 150×, about 300×, from about 1.5× to about 300×, from about 100× to about 150×, and all values within these ranges, as well as greater than 5×, greater than 50×, greater than 100× brighter than any single laser diode used in the collection of laser diodes. In particular, this n-times increase in brightness is in embodiments of laser beams in the blue, green, blue-green and visible wavelengths.

Table 1 shows the power, brightness and performance that can be achieved with 140-2.5-Watt laser diodes in a two dimensional spectrally beam combined configuration. This table illustrates how the power and brightness of laser systems based on a building block 350-Watt module scales to the multi-kW power level using fiber combiners to launch into a process fiber.

TABLE 1

| Modules | Output Power | BPP (mm-mrad) |
| --- | --- | --- |
| 1 | 350 | 5 |
| 2 | 700 | 13 |
| 3 | 1050 | 14 |
| 4 | 1400 | 15 |
| 5 | 1750 | 17 |
| 6 | 2100 | 19 |
| 7 | 2450 | 19 |
| 8 | 2800 | 21 |
| 9 | 3150 | 23 |
| 10 | 3500 | 24 |
| 11 | 3850 | 25 |
| 12 | 4200 | 27 |
| 13 | 4550 | 27 |
| 14 | 4900 | 28 |
| 15 | 5250 | 29 |
| 16 | 5600 | 30 |
| 17 | 5950 | 31 |
| 18 | 6300 | 32 |

The same modules may also be combined in free space which conserves brightness but makes module replacement slightly more complicated. The power and beam parameter products that can be achieved with free space combination are shown in Table 2.

TABLE 2

| Output Power | Process Fiber (microns) | BPP (mm-mrad) |
| --- | --- | --- |
| 350 | 45 | 5 |
| 700 | 90 | 9 |
| 1050 | 97 | 10 |
| 1400 | 109 | 11 |
| 1750 | 122 | 13 |
| 2100 | 135 | 14 |
| 2450 | 135 | 14 |
| 2800 | 149 | 16 |
| 3150 | 163 | 17 |
| 3500 | 172 | 18 |
| 3850 | 181 | 19 |
| 4200 | 191 | 20 |

TABLE 2-continued

| Output Power | Process Fiber (microns) | BPP (mm-mrad) |
| --- | --- | --- |
| 4550 | 195 | 20 |
| 4900 | 203 | 21 |
| 5250 | 208 | 22 |
| 5600 | 216 | 23 |
| 5950 | 219 | 23 |
| 6300 | 230 | 24 |

The following table illustrates the effect of using a higher power blue laser diode with each device being approximately 6.5 Watts. The base module of 140 laser diodes is now approximately 900 Watts and these modules are combined through fiber combiners to build high power, high brightness blue laser diode systems. As shown in Table 3.

TABLE 3

| Number of Modules | Output Power | BPP (mm-mrad) |
| --- | --- | --- |
| 1 | 882 | 5 |
| 2 | 1,764 | 13 |
| 3 | 2,646 | 14 |
| 4 | 3,528 | 15 |
| 5 | 4,410 | 17 |
| 6 | 5,292 | 19 |
| 7 | 6,174 | 19 |
| 8 | 7,056 | 21 |
| 9 | 7,938 | 23 |
| 10 | 8,820 | 24 |
| 11 | 9,702 | 25 |
| 12 | 10,584 | 27 |
| 13 | 11,466 | 27 |
| 14 | 12,348 | 28 |
| 15 | 13,230 | 29 |
| 16 | 14,112 | 30 |
| 17 | 14,994 | 31 |
| 18 | 15,876 | 32 |

EXAMPLES

The following examples are provided to illustrate various embodiments of the present laser systems and operations and including laser systems for welding components, including components in electronic storage devices. These examples are for illustrative purposes, may be prophetic, and should not be viewed as, and do not otherwise limit the scope of the present inventions.

Example 1

An embodiment of a high power, high brightness laser system has two individual high power laser diodes. The diodes can be from about 2 W to 10 W. A preferable diode laser is 10 Watts with a stripe width <100 microns which is achievable in the infrared. The diodes in the blue wavelength range can be about 2.5 W to 6.5 Watts with a stripe width less than 40 microns. The system has a common external cavity shared by the individual high-power laser diodes. The system can be scaled, having three, four, ten, a dozen and more laser diodes (e.g., FIG. 3). There are further collimating optics for creating parallel beams from each of the high-power laser diodes. The system has a beam combination optics in the common external cavity which determines the wavelength of each laser diode and each laser diode is aligned to be co-linear and overlapping in space. The system provides a spatial brightness of the laser source from the system that is n-times the brightness of a single laser diode where brightness is defined as the combined power divided by the aperture-divergence product. A two-dimensional array that completely fills the available gain curve for the laser diode can produce a source that is 30× the brightness of a single laser diode (e.g., FIG. 3). Even higher spatial brightness is feasible by selecting laser diodes that have a different gain spectrum outside of the gain spectrum of the first 30 laser diodes making it feasible to increase the spatial brightness of the laser diode source by another factor of 2 to 60× the spatial brightness of a single device. This can be expanded over a wide range depending on the final bandwidth of the laser source desired. A practical range is ~100 nm, e.g., 405-505 nm, for a total spatial brightness increase approaching 150×.

Example 2

In an embodiment of the external cavity the beam combination optic is a set of optical filters that are used at the edge of either the low pass or high pass end of the spectrum for a bandpass filter.

Example 3

In the embodiment of the system of Example 1, the external cavity laser is operating in the 400-500 nm range with an output power of >1 Watt and a beam parameter product of 0.1 mm-mrad or larger.

Example 4

In an embodiment the external cavity laser is operating in the 500-600 nm range with an output power of >1 Watt and a beam parameter product of 0.1 mm-mrad or larger.

Example 5

In an embodiment the external cavity laser is operating in the 720-800 nm range with an output power of >1 Watt and a beam parameter product of 0.1 mm-mrad or larger.

Example 6

In an embodiment of the external cavity laser is operating in the 800-900 nm range with an output power of >1 Watt and a beam parameter product of 0.1 mm-mrad or larger.

Example 7

In an embodiment of the external cavity laser is operating in the 900-1200 nm range with an output power of >1 Watt and a beam parameter product of 0.1 mm-mrad or larger.

Example 8

In an embodiment of the external cavity laser is operating in the 1200 nm-1120 nm range with an output power of >1 Watt and a beam parameter product of 0.1 mm-mrad or larger.

Example 9

In an embodiment of the external cavity laser is operating in the 1400-1500 nm range with an output power of >1 Watt and a beam parameter product of 0.1 mm-mrad or larger.

Example 10

In an embodiment of the external cavity laser is operating in the 1500-2200 nm range with an output power of >1 Watt and a beam parameter product of 0.1 mm-mrad or larger.

Example 11

In an embodiment the external cavity laser based on interband cascade lasers described in (1) operating in the 2200-3000 nm range with an output power of >1 Watt and a beam parameter product of 0.1 mm-mrad or larger.

Example 12

In an embodiment the external cavity laser based on quantum cascade lasers described in (1) operating in the 3000 nm-4000 nm range with an output power of >1 Watt and a beam parameter product of 0.1 mm-mrad or larger.

Example 13

In an embodiment the external cavity of the system has a beam combination optic that is a set of Volume Bragg Grating filters. These filters can have a very narrow reflection spectrum and do not rely on the difference between two filters like the dichroic combiner approach to achieve the same performance. In addition, these Bragg Gratings can be written directly into a single piece of photosensitive glass and eliminate the need for post polishing and alignment of the individual blocks. One or more of the volume Bragg gratings redirects a portion of the optical spectrum from an individual laser diode to be collinear with the previous laser diode in the array. In this manner the brightness of the sum of the individual laser diode beams after being directed by the volume Bragg gratings(s) is N times brighter than that of an individual laser diode beam, with N being the number of laser diodes being combined. In this manner in a series of N volume Bragg gratings, the points of maximum transmission through volume Bragg grating N coincide with the N−1, N−2, N−3, . . . $1^{st}$ peaks of the lasing spectra of the N−1, N−2, N−3, . . . $1^{st}$ laser diodes, while simultaneously providing maximum beam deflection of laser diode N. This embodiment can be utilized in the embodiment of Example 1 and other Examples. An embodiment of which is shown in FIG. 1A Example 14

In an embodiment of the laser system, for example a system of Example 13, the laser system operates on the slow axis of the emitted laser diode light and the TE-mode of individual reflection volume Bragg grating(s).

Example 15

In an embodiment of the laser system, for example a system of Example 13, the laser system operates on the fast axis of the emitted laser diode light and the TE-mode of individual reflection volume Bragg grating(s).

Example 16

In an embodiment of the laser system, for example a system of Example 13, the laser system that operates on the slow axis of the emitted laser diode light and the TM-mode of individual reflection volume Bragg grating(s).

Example 17

In an embodiment of the laser system, for example a system of Example 13, the laser system that operates on the fast axis of the emitted laser diode light and the TM-mode of individual reflection volume Bragg grating(s).

Example 18

In an embodiment of the laser system, for example a system of Example 13, the laser system operates on the slow axis of the emitted laser diode light and the TE-mode of individual transmission volume Bragg grating(s).

Example 19

In an embodiment of the laser system, for example a system of Example 13, the laser system operates on the fast axis of the emitted laser diode light and the TE-mode of individual transmission volume Bragg grating(s).

Example 20

In an embodiment of the laser system, for example a system of
Example 13, the laser system operates on the slow axis of the emitted laser diode light and the TM-mode of individual transmission volume Bragg grating(s).

Example 21

In an embodiment of the laser system, for example a system of Example 13, the laser system operates on the fast axis of the emitted laser diode light and the TM-mode of individual transmission volume Bragg grating(s).

Example 22

In an embodiment of the laser system, for example a system of Example 13, the laser system operates on the slow axis of the emitted laser diode light and the TE-mode of individual reflection volume Bragg grating(s) fabricated in a single piece of material.

Example 23

In an embodiment of the laser system, for example a system of Example 13, the laser system operates on the fast axis of the emitted laser diode light and the TE-mode of individual reflection volume Bragg grating(s) fabricated in a single piece of material.

Example 24

In an embodiment of the laser system, for example a system of Example 13, the laser system operates on the slow axis of the emitted laser diode light and the TM-mode of individual reflection volume Bragg grating(s) fabricated in a single piece of material.

Example 25

In an embodiment of the laser system, for example a system of Example 13, the laser system operates on the fast axis of the emitted laser diode light and the TM-mode of individual reflection volume Bragg grating(s) fabricated in a single piece of material.

Example 26

In an embodiment of the laser system, for example a system of Example 13, the laser system operates on the slow axis of the emitted laser diode light and the TE-mode of individual transmission volume Bragg grating(s) fabricated in a single piece of material.

Example 27

In an embodiment of the laser system, for example a system of Example 13, the laser system operates on the fast axis of the emitted laser diode light and the TE-mode of individual transmission volume Bragg grating(s) fabricated in a single piece of material.

Example 28

In an embodiment of a system, the system has one or more optical coatings that redirects a portion of the power from an individual laser diode at an angle up to 90° with respect to the laser diode output light propagation direction after collimation. In this system, the optical propagation directions in the near-field and far-field are identical among two or more individual laser diodes after being redirected by the optical coating(s). In this manner the brightness of the sum of the individual laser diode beams after being directed by the optical coating(s) is N times brighter than that of an individual laser diode beam, with N being the number of laser diodes being combined. Thus, in a series of N optical coatings, the points of maximum transmission through optical coating N coincide with the N−1, N−2, N−3, . . . $1^{st}$ peaks of the lasing spectra of the N−1, N−2, N−3, . . . $1^{st}$ laser diodes, while simultaneously providing maximum beam deflection of laser diode N. This embodiment can be utilized in the embodiment of Example 1, and other Examples, including the embodiment of FIG. 1.

Example 29

In an embodiment a laser source has one or more volume Bragg gratings. The output light direction from the optical coating(s) is 90° with respect to the output light direction from the volume Bragg grating(s). The brightness of the sum of the individual laser diode beams after being combined by the volume Bragg gratings(s) and the optical coating(s) is N times brighter than that of an individual laser diode beam, with N is the number of individual laser diode beams, C is the number of optical coating(s), and N/C is the number of individual laser diode beams being combined by the volume Bragg grating(s) as groups. The optical bandwidths of each individual combination of laser diodes combined by the volume Bragg grating(s) are mutually exclusive.

Thus, given an arbitrary central blue wavelength $\lambda_c$, the optical bandwidth from volume Bragg grating M=$\Delta\lambda_M$, the optical bandwidth of volume Bragg grating M−1=$\Delta\lambda_{M-1}$ such that $\Delta\lambda_{M-1} \approx \Delta\lambda_M$ and $\lambda_c(\Delta\lambda_M)-\lambda_c(\Delta\lambda_{M-1}) \geq \Delta\lambda_{M-1}$, the optical bandwidth from volume Bragg grating M−2=$\Delta\lambda_{M-2}$, such that $\Delta\lambda_{M-2} \approx \Delta\lambda_M$ and $\lambda_c(\Delta\lambda_{M-1})-\lambda_c(\Delta\lambda_{M-2}) \geq \Delta\lambda_{M-2}$, and so on.

Further, given an arbitrary central blue wavelength $\lambda_c$, the optical bandwidth from optical coating X=$\Delta\lambda_X$, the optical bandwidth of optical coating X−1=$\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from optical coating $X-2=\Delta\lambda_{X-2}$, such that $\Delta\lambda_{X-2} \approx \Delta\lambda_X$ and $\lambda_c(\Delta\lambda_{X-1}) - \lambda_c(\Delta\lambda_{X-2}) \geq \Delta\lambda_{X-2}$, and so on.

Further, given an arbitrary central blue wavelength $\lambda_c$, the optical bandwidth from optical coating $X=\Delta\lambda_X$ and the optical bandwidth of the sum of volume Bragg grating(s) $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from optical coating $X-1=\Delta\lambda_{X-1}$ and the optical bandwidth of the sum of volume Bragg grating(s) $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

Example 30

In an embodiment the system has one or more optical coatings. The output light direction from the volume Bragg grating(s) is 90° with respect to the output light direction from the optical coating(s). The brightness of the sum of the individual laser diode beams after being combined by the volume Bragg gratings(s) and the optical coating(s) is N times brighter than that of an individual laser diode beam, with N is the number of individual laser diode beams, B is the number of volume Bragg grating(s), and N/B is the number of individual laser diode beams being combined by the optical coating(s) as groups. The optical bandwidths of each individual combination of laser diodes combined by the volume Bragg grating(s) are mutually exclusive.

The optical bandwidths of each individual combination of laser diodes combined by optical coating(s) are mutually exclusive.

Thus, given an arbitrary central blue wavelength $\lambda_c$, the optical bandwidth from volume Bragg grating $M=\Delta\lambda_M$, the optical bandwidth of volume Bragg grating $M-1=\Delta\lambda_{M-1}$ such that $\Delta\lambda_{M-1} \approx \Delta\lambda_M$ and $\lambda_c(\Delta\lambda_M) - \lambda_c(\Delta\lambda_{M-1}) \geq \Delta\lambda_{M-1}$, the optical bandwidth from volume Bragg grating $M-2=\Delta\lambda_{M-2}$, such that $\Delta\lambda_{M-2} \approx \Delta\lambda_M$ and $\lambda_c(\Delta\lambda_{M-1}) - \lambda_c(\Delta\lambda_{M-2}) \geq \Delta\lambda_{M-2}$, and so on.

Further, given an arbitrary central blue wavelength $\lambda_c$, the optical bandwidth from optical coating $X=\Delta\lambda_X$, the optical bandwidth of optical coating $X-1=\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from optical coating $X-2=\Delta\lambda_{X-2}$, such that $\Delta\lambda_{X-2} \approx \Delta\lambda_X$ and $\lambda_c(\Delta\lambda_{X-1}) - \lambda_c(\Delta\lambda_{X-2}) \geq \Delta\lambda_{X-2}$, and so on.

Further, given an arbitrary central blue wavelength $\lambda_c$, the optical bandwidth from volume Bragg grating $X=\Delta\lambda_X$ and the optical bandwidth of the sum of coatings(s) $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from volume Bragg grating $X-1=\Delta\lambda_{X-1}$ and the optical bandwidth of the sum of optical coating(s) $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

Example 30A

The embodiments of Example 30 are utilized in the embodiments of the other Examples.

Example 31

In an embodiment of a laser system, the system the output light direction from the following volume Bragg grating(s) is 90° with respect to the output light direction from the previous volume Bragg grating(s). The brightness of the sum of the individual laser diode beams after being combined by the volume Bragg gratings(s) is N times brighter than that of an individual laser diode beam, with N is the number of individual laser diode beams, B is the number of secondary volume Bragg grating(s), and N/B is the number of individual laser diode beams being combined by the primary volume Bragg grating(s) as groups.

The optical bandwidths of each individual combination of laser diodes combined by the primary volume Bragg grating(s) are mutually exclusive. The optical bandwidths of each individual combination of laser diodes combined by the secondary volume Bragg grating(s) are mutually exclusive.

Thus, given an arbitrary central blue wavelength $\lambda_c$, the optical bandwidth from the primary volume Bragg grating $M=\Delta\lambda_M$, the optical bandwidth of the primary volume Bragg grating $M-1=\Delta\lambda_{M-1}$ such that $\Delta\lambda_{M-1} \approx \Delta\lambda_M$ and $\lambda_c(\Delta\lambda_M) - \lambda_c(\Delta\lambda_{M-1}) \geq \Delta\lambda_{M-1}$, the optical bandwidth from the primary volume Bragg grating $M-2=\Delta\lambda_{M-2}$, such that $\Delta\lambda_{M-2} \approx \Delta\lambda_M$ and $\lambda_c(\Delta\lambda_{M-1}) - \lambda_c(\Delta\lambda_{M-2}) \geq \Delta\lambda_{M-2}$, and so on.

Further, given an arbitrary central blue wavelength $\lambda_c$, the optical bandwidth from the secondary volume Bragg grating $X=\Delta\lambda_X$, the optical bandwidth of secondary volume Bragg grating $X-1=\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from secondary volume Bragg grating $X-2=\Delta\lambda_{X-2}$, such that $\Delta\lambda_{X-2} \approx \Delta\lambda_X$ and $\lambda_c(\Delta\lambda_{X-1}) - \lambda_c(\Delta\lambda_{X-2}) \geq \Delta\lambda_{X-2}$, and so on.

Additionally, given an arbitrary central blue wavelength $\lambda_c$, the optical bandwidth from the secondary volume Bragg grating $X=\Delta\lambda_X$ and the optical bandwidth of the sum of the primary volume Bragg gratings $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from the secondary volume Bragg grating $X-1=\Delta\lambda_{X-1}$ and the optical bandwidth of the sum of the primary volume Bragg gratings $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

Example 31A

The embodiments of Example 31 are utilized in the embodiments of the other Examples.

Example 32

In an embodiment a laser system has one or more optical coatings(s).

The output light direction from the following optical coating(s) is 90° with respect to the output light direction from the previous optical coating(s). The brightness of the sum of the individual laser diode beams after being combined by the optical coating(s) N times brighter than that of an individual laser diode beam, with N is the number of individual laser diode beams, C is the number of secondary optical coating(s), and N/C is the number of individual laser diode beams being combined by the primary optical coatings(s) as groups.

The optical bandwidths of each individual combination of laser diodes combined by the primary optical coatings(s) are mutually exclusive. The optical bandwidths of each individual combination of laser diodes combined by the secondary optical coating(s) are mutually exclusive.

Thus, given an arbitrary central blue wavelength $\lambda_c$, the optical bandwidth from the primary optical coating $M=\Delta\lambda_M$, the optical bandwidth of the primary optical coating $M-1=\Delta\lambda_{M-1}$ such that $\Delta\lambda_{M-1} \approx \Delta\lambda_M$ and $\lambda_c(\Delta\lambda_M) - \lambda_c(\Delta\lambda_{M-1}) \geq \Delta\lambda_{M-1}$, the optical bandwidth from the primary optical coating $M-2 \approx \Delta\lambda_{M-2}$, such that $\Delta\lambda_{M-2} = \Delta\lambda_M$ and $\lambda_c(\Delta\lambda_{M-1}) - \lambda_c(\Delta\lambda_{M-2}) \geq \Delta\lambda_{M-2}$, and so on.

Further, given an arbitrary central blue wavelength $\lambda_c$, the optical bandwidth from the secondary optical coating $X=\Delta\lambda_X$, the optical bandwidth of secondary optical coating $X-1=\Delta\lambda_{X-1}$ such that $\Delta\lambda_{X-1} \approx \Delta\lambda_X$ and $\lambda_c(\Delta\lambda_X) - \lambda_c(\Delta\lambda_{X-1})$ $\geq \Delta\lambda_{X-1}$, the optical bandwidth from secondary optical coating X-2=$\Delta\lambda_{X2}$, such that $\Delta\lambda_{X-2} \approx \Delta\lambda_X$ and $\lambda_c(\Delta\lambda_{X-1})-\lambda_c(\Delta\lambda_{X-2}) \geq \Delta\lambda_{X-2}$, and so on.

Additionally, given an arbitrary central blue wavelength $\lambda_c$, the optical bandwidth from the secondary coating X=$\Delta\lambda_X$ and the optical bandwidth of the sum of the primary optical coatings $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from the secondary optical coating X-1=$\Delta\lambda_{X-1}$ and the optical bandwidth of the sum of the primary optical coatings $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

Example 32A

The embodiments of Example 32 are utilized in the embodiments of the other Examples.

It is noted that there is no requirement to provide or address the theory underlying the novel and groundbreaking processes, systems, materials, performance or other beneficial features and properties that are the subject of, or associated with, embodiments of the present inventions. Nevertheless, various theories are provided in this specification to further advance the art in this area. The theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the function-features of embodiments of the methods, articles, materials, devices and system of the present inventions; and such later developed theories shall not limit the scope of protection afforded the present inventions.

The various embodiments of systems, equipment, techniques, methods, activities and operations set forth in this specification may be used for various other activities and in other fields in addition to those set forth herein. Additionally, these embodiments, for example, may be used with: other equipment or activities that may be developed in the future; and with existing equipment or activities which may be modified, in-part, based on the teachings of this specification. Further, the various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

What is claimed:

1. A high power, high brightness laser system, comprising:
   a. a plurality of laser diodes, each having a power of not less than 0.25 W, wherein each of the plurality of laser diodes is configured to provide a laser beam along a laser beam path;
   b. a common external cavity shared by each of the plurality of laser diodes;
   c. a collimating optic in the laser beam paths for creating parallel beams from each of the plurality of laser diodes;
   d. a beam combination optic in the common external cavity and in the laser beam paths; wherein the beam combination optic determines the wavelength of each laser diode and aligns each laser beam path from the plurality of laser diodes to be co-linear and overlapping in space, whereby a composite output laser beam is provided; and,
   e. the spatial brightness of the composite output laser beam is n times the brightness of any single laser diode in the plurality of laser diodes, where spatial brightness is defined as the combined power divided by the aperture-divergence product.

2. The laser system of claim 1, wherein the beam combination optic consists of an optical cavity formed from a set of optical filters that are used at the edge of either the low pass or high pass end of the spectrum for a bandpass filter and an output coupler or a mirror.

3. The laser system of claim 1, operating in the 400-500 nm range with an output power of not less than 10 Watts and a beam parameter product of 0.1 mm-mrad or larger.

4. The laser system of claim 1, operating in the 500-600 nm range with an output power of not less than 10 Watts and a beam parameter product of 0.1 mm-mrad or larger.

5. The laser system of claim 1, operating in the 720-800 nm range with an output power not less than 10 Watts and a beam parameter product of 0.1 mm-mrad or larger.

6. The laser system of claim 1, operating in the 800-900 nm range with an output power of not less than 10 Watts and a beam parameter product of 0.1 mm-mrad or larger.

7. The laser system of claim 1, operating in the 900-1200 nm range with an output power of not less than 10 Watts and a beam parameter product of 0.1 mm-mrad or larger.

8. The laser system of claim 1, operating in the 1200 nm-1120 nm range with an output power of not less than 10 Watts and a beam parameter product of 0.1 mm-mrad or larger.

9. The laser system of claim 1, operating in the 1400-1500 nm range with an output power of not less than 10 Watts and a beam parameter product of 0.1 mm-mrad or larger.

10. The laser system of claim 1, operating in the 1500-2200 nm range with an output power of not less than 10 Watts and a beam parameter product of 0.1 mm-mrad or larger.

11. The laser system of claim 1, wherein the plurality of laser diodes are interband cascade lasers; and where in the system is operating in the 2200-3000 nm range with an output power of not less than 10 Watts and a beam parameter product of 0.1 mm-mrad or larger.

12. The laser system of claim 1, wherein the beam combination optic comprises a plurality of volume Bragg grating filters; wherein a first volume Bragg gratings is configured to redirect a portion of the optical spectrum of a first laser beam from a first laser diode in the plurality of laser diodes to be collinear with the laser beam from a second laser diode in the plurality of laser diodes.

13. The laser system of claim 1, wherein the plurality of laser diodes are quantum cascade lasers and the system is operating in the 3000 nm-12000 nm range with an output power of not less than 10 Watts and a beam parameter product of 0.1 mm-mrad or larger.

14. The laser systems as is any one of claims 1, 2, and 3, wherein n is not less than 5.

15. The laser systems as is any one of claims 1, 2, 3, 4, and 5, wherein the beam combination optic comprises a plurality of volume Bragg grating filters; wherein a first volume Bragg gratings is configured to redirect a portion of the optical spectrum of a first laser beam from a first laser diode in the plurality of laser diodes to be collinear with the a laser beam from a second laser diode in the plurality of laser diodes; and wherein n is not less than 5.

16. The laser system of claim 1, wherein the plurality of laser diodes consists of N diodes; wherein each of the N diodes defines a $1^{st}$ peak of a lasing spectra; wherein the beam combining optic consists of a plurality of volume Bragg grating consisting of N-1 volume Bragg grating filters; the volume Bragg gratings and N-1 of the laser diodes configured in an optical association such that points of maximum transmission through each volume Bragg grating of the plurality of volume Bragg gratings coincide with the N-1, N-2 to N-(N-1) $1^{st}$ peak of N-1 laser diodes in the plurality of laser diodes; whereby the N is equal to n.

17. The laser system of claim 16, wherein N-1 is equal to n.

18. The laser system of claim 16, wherein laser diode N' is not optically associated with a volume Bragg grating and the system provides the maximum beam deflection of laser diode N'.

19. The laser system of claim 16 that operates on the slow axis of the emitted laser diode light and the TE-mode of individual reflection volume Bragg grating.

20. The laser system of claim 17 that operates on the fast axis of the emitted laser diode light and the TE-mode of individual reflection volume Bragg grating.

21. The laser system of claim 18 that operates on the slow axis of the emitted laser diode light and the TM-mode of individual reflection volume Bragg grating.

22. The laser system of claim 16 that operates on the fast axis of the emitted laser diode light and the TM-mode of individual reflection volume Bragg grating.

23. The laser system of claim 17 that operates on the slow axis of the emitted laser diode light and the TE-mode of individual transmission volume Bragg grating.

24. The laser system of claim 18 that operates on the fast axis of the emitted laser diode light and the TE-mode of individual transmission volume Bragg grating.

25. The laser system of claim 16 that operates on the slow axis of the emitted laser diode light and the TM-mode of individual transmission volume Bragg grating.

26. The laser system of claim 16 that operates on the fast axis of the emitted laser diode light and the TM-mode of individual transmission volume Bragg grating(s).

27. The laser system of claim 16, operating in the 400-500 nm range with an output power of >1 Watt and a beam parameter product of 0.1 mm-mrad or larger.

28. The laser system of claim 16, operating in the 500-600 nm range with an output power of >1 Watt and a beam parameter product of 0.1 mm-mrad or larger.

29. The laser system of claim 16, operating in the 720-800 nm range with an output power of >1 Watt and a beam parameter product of 0.1 mm-mrad or larger.

30. A high power, high brightness laser system comprising:
   a. a plurality of N laser diodes, wherein each of the plurality of laser diodes is configured to provide a laser beam along a laser beam path at a laser beam power; wherein the laser beam path comprises an output propagation direction;
   b. a common external cavity shared by each of the plurality of laser diodes;
   c. a collimating optic in the output propagation direction laser beam paths for creating parallel beams from each of the plurality of laser diodes;
   d. a beam combination optic in the common external cavity and in the output propagation direction laser beam paths;
   e. wherein the beam combining optic comprises N-1 optical elements comprising optical coatings, whereby the optical elements redirect a portion of the optical spectrum of the laser beam from a laser diode in the plurality of laser diodes at an angle up to 90° with respect to the output propagation direction laser beam paths, thereby providing a composite output laser beam defining a brightness; and,
   f. whereby the brightness of the composite output laser beam is n times the brightness of any single laser diode in the plurality of laser diodes, where brightness is defined as the combined power divided by the aperture-divergence product.

31. The laser source of claim 30, that operates on the slow axis of the emitted laser diode light and the TE-mode of individual reflection optical coating(s).

32. The laser source of claim 30, that operates on the slow axis of the emitted laser diode light and the TM-mode of individual reflection optical coating(s) fabricated by optical bonding or other low-loss method into a single piece of material.

33. The laser source of claim 30, that operates on the fast axis of the emitted laser diode light and the TM-mode of individual reflection optical coating (s) fabricated by optical bonding or other low-loss method into a single piece of material.

34. The laser source of claim 30, wherein N=n.

35. The laser source of claim 30, wherein N-1=n.

36. The laser system of claim 16, operating in the 400-500 nm range with an output power of not less than 10 W and a beam parameter product of 0.1 mm-mrad or larger.

37. The laser system of claim 16, operating in the 500-600 nm range with an output power of not less than 10 W and a beam parameter product of 0.1 mm-mrad or larger.

38. The laser systems as is any one of claims 30 and 36, wherein the laser beam power is not less than 0.5 W.

39. The laser systems as is any one of claims 30 and 36, wherein the laser beam power is not less than 1 W.

40. A high power, high brightness laser system comprising:
   a. a plurality of N laser diodes, wherein each of the plurality of laser diodes is configured to provide a laser beam along a laser beam path at a laser beam power; wherein the laser beam path comprises an output propagation direction;
   b. a common external cavity shared by each of the plurality of laser diodes;
   c. a collimating optic in the output propagation direction laser beam paths for creating parallel beams from each of the plurality of laser diodes;
   d. a beam combination optic in the common external cavity and in the output propagation direction laser beam paths;
   e. wherein the beam combining optic comprises N-1 optical elements
   f. wherein the optical elements consist of volume Bragg gratings and optical coatings elements, wherein the volume Bragg gratings and the optical coating elements follow each other along the laser beam paths; wherein an output light direction from the optical coating is up to 90° with respect to the output light direction from the volume Bragg grating, thereby providing a combined output laser beam defining a brightness; and, g. the brightness of the sum of the individual laser diode beams after being combined by the volume Bragg gratings and the optical coatings is n times brighter than that of an individual laser diode beam; wherein n=N or n=N-1, N is the number of individual laser diode beams, C is the number of optical coatings, and N/C is the number of individual laser diode beams being combined by the volume Bragg gratings.

41. The laser system of claim 40, wherein, the optical bandwidths of each individual combination of laser diodes combined by the volume Bragg grating(s) are mutually exclusive.

42. The laser system of claim 41, wherein, given an arbitrary central blue wavelength $\lambda_c$, the optical bandwidth from volume Bragg grating M=$\Delta\lambda_M$, the optical bandwidth of volume Bragg grating M-1=$\Delta\lambda_{M-1}$ such that $\Delta\lambda_{M-1} \approx \Delta\lambda_M$ and $\lambda_c (\Delta\lambda_M) - \lambda_c(\Delta\lambda_{M-1}) \geq \Delta\lambda_{M-1}$, the optical bandwidth from volume Bragg grating M-2=$\Delta\lambda_{M-2}$, such that $\Delta\lambda_{M-2} \approx \Delta\lambda_M$ and $\lambda_c(\Delta\lambda_{M-1}) - \lambda_c(\Delta\lambda_{M-2}) \geq \Delta\lambda_{M-2}$, and so on.

43. The laser system of claim 41, wherein given an arbitrary central blue wavelength $\lambda_c$, the optical bandwidth from optical coating X=$\Delta\lambda_X$, the optical bandwidth of optical coating X-1=$\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from optical coating X-2=$\Delta\lambda_{X-2}$, such that $\Delta\lambda_{X-2} \approx \Delta\lambda_X$ and $\lambda_c(\Delta\lambda_{X-1}) - \lambda_c(\Delta\lambda_{X-2}) \geq \Delta\lambda_{X-2}$, and so on.

44. The laser system of claim 41, wherein given an arbitrary central blue wavelength $\lambda_c$, the optical bandwidth from optical coating X=$\Delta\lambda_X$ and the optical bandwidth of the sum of volume Bragg grating(s) $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from optical coating X-1=$\Delta\lambda_{X-1}$ and the optical bandwidth of the sum of volume Bragg grating(s) $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

45. The laser system of claim 40, that utilizes the reflection volume Bragg grating(s) operating in the laser diode slow axis and TE-mode of the reflection volume Bragg grating(s), followed by optical coating(s) operating in the laser diode fast axis and TE-mode of the optical coating(s).

46. The laser system of claim 41, that utilizes the reflection volume Bragg grating(s) operating in the laser diode slow axis and TE-mode of the reflection volume Bragg grating(s), followed by optical coating(s) operating in the laser diode fast axis and TM-mode of the optical coating(s).

47. The laser system of claim 42, that utilizes the reflection volume Bragg grating(s) operating in the laser diode slow axis and TM-mode of the reflection volume Bragg grating(s), followed by optical coating(s) operating in the laser diode fast axis and TE-mode of the optical coating(s).

48. The laser system of claim 43, that utilizes the reflection volume Bragg grating(s) operating in the laser diode slow axis and TM-mode of the reflection volume Bragg grating(s), followed by optical coating(s) operating in the laser diode fast axis and TM-mode of the optical coating(s).

49. The laser system of claim 40, that utilizes the reflection volume Bragg grating(s) operating in the laser diode fast axis and TM-mode of the reflection volume Bragg grating(s), followed by optical coating(s) operating in the laser diode slow axis and TM-mode of the optical coating(s).

50. A high power, high brightness laser system comprising:

a. a plurality of N laser diodes, wherein each of the plurality of laser diodes is configured to provide a laser beam along a laser beam path at a laser beam power; wherein the laser beam path comprises an output propagation direction;

b. a common external cavity shared by each of the plurality of laser diodes;

c. a collimating optic in the output propagation direction laser beam paths for creating parallel beams from each of the plurality of laser diodes;

d. a beam combination optic in the common external cavity and in the output propagation direction laser beam paths;

e. wherein the beam combining optic comprises N-1 optical elements;

f. wherein the optical elements consist of volume Bragg gratings and optical coatings elements, wherein the volume Bragg gratings and the optical coating elements follow each other along the laser beam paths; wherein an output light direction from the volume Bragg grating is up to 90° with respect to the output light direction from the optical coating element, thereby providing a combined output laser beam defining a brightness; and, g. the brightness of the sum of the individual laser diode beams after being combined by the volume Bragg gratings and the optical coatings is n times brighter than that of an individual laser diode beam; wherein n=N or n=N-1, N is the number of individual laser diode beams, B is the number of volume Bragg gratings, and N/B is the number of individual laser diode beams being combined by the optical coatings as groups.

51. The laser system of claim 50, wherein, the optical bandwidths of each individual combination of laser diodes combined by the volume Bragg grating(s) are mutually exclusive.

52. The laser system of claim 51, wherein, given an arbitrary central blue wavelength the optical bandwidth from volume Bragg grating M=$\Delta\lambda_M$, the optical bandwidth of volume Bragg grating M-1=$\Delta\lambda_{M-1}$ such that $\Delta\lambda_{M-1} \approx \Delta\lambda_M$ and $\lambda_c(\Delta\lambda_M) - \lambda_c(\Delta\lambda_{M-1}) \geq \Delta\lambda_{M-1}$, the optical bandwidth from volume Bragg grating M-2=$\Delta\lambda_{M-2}$, such that $\Delta\lambda_{M-2} \approx \Delta\lambda_M$ and $\lambda_c(\Delta\lambda_{M-1}) - \lambda_c(\Delta\lambda_{M-2}) \geq \Delta\lambda_{M-2}$, and so on.

53. The laser system of claim 51, wherein given an arbitrary central blue wavelength $\lambda_c$, the optical bandwidth from optical coating X=$\Delta\lambda_x$, the optical bandwidth of optical coating X-1=$\Delta\lambda_{X-1}$ such that $\Delta\lambda_{X-1} \approx \Delta\lambda_X$ and $\lambda_c(\Delta\lambda_X) - \lambda_c(\Delta\lambda_{X-1}) \geq \Delta\lambda_{X-1}$, the optical bandwidth from optical coating X-2=$\Delta\lambda_{X-2}$, such that $\Delta\lambda_{X-2} \approx \Delta\lambda_X$ and $\lambda_c(\Delta\lambda_{X-1}) - \lambda_c(\Delta\lambda_{X-2}) \geq \Delta\lambda_{X-2}$, and so on.

54. The laser system of claim 51, wherein given an arbitrary central blue wavelength the optical bandwidth from optical coating X=$\Delta\lambda_x$ and the optical bandwidth of the sum of volume Bragg grating(s) $\Sigma\Delta\lambda_{M1}$ such that $\Delta\lambda_X \geq \Sigma\Delta\lambda_{M1}$ and $\lambda_c(\Delta\lambda_X) \approx \lambda_c(\Sigma\Delta\lambda_{M1})$, the optical bandwidth from optical coating X-1=$\Delta\lambda_{X-1}$ and the optical bandwidth of the sum of volume Bragg grating(s) $\Sigma\Delta\lambda_{M2}$ such that $\Delta\lambda_{X-1} \geq \Sigma\Delta\lambda_{M2}$ and $\lambda_c(\Delta\lambda_{X-1}) \approx \lambda_c(\Sigma\Delta\lambda_{M2})$, and so on.

55. The laser system of claim 51, that utilizes the optical coating(s) operating in the laser diode fast axis and TE-mode of the optical coating(s), followed by reflection volume Bragg grating(s) operating in the laser diode slow axis and TE-mode of the reflection volume Bragg grating(s).

56. The laser system of claim 51, that utilizes the optical coating(s) operating in the laser diode fast axis and TE-mode of the optical coating(s), followed by reflection volume Bragg grating(s) operating in the laser diode slow axis and TM-mode of the reflection volume Bragg grating(s).

57. The laser system of claim 51, that utilizes the optical coating(s) operating in the laser diode fast axis and TM-mode of the optical coating(s), followed by reflection volume Bragg grating(s) operating in the laser diode slow axis and TE-mode of the reflection volume Bragg grating(s).

58. The laser system of claim 51, that utilizes the optical coating(s) operating in the laser diode fast axis and TM-mode of the optical coating(s), followed by reflection volume Bragg grating(s) operating in the laser diode slow axis and TM-mode of the reflection volume Bragg grating(s).

59. The laser system of claim 51, that utilizes the optical coating(s) operating in the laser diode slow axis and TM-mode of the optical coating(s), followed by transmission volume Bragg grating(s) operating in the laser diode fast axis and TE-mode of the transmission volume Bragg grating(s).

60. The laser system of claim 51, that utilizes the optical coating(s) operating in the laser diode fast axis and TM-mode of the optical coating(s), followed by transmission volume Bragg grating(s) operating in the laser diode slow axis and TM-mode of the transmission volume Bragg grating(s).

61. A high power, high brightness laser system comprising:
   a. a plurality of N laser diodes, wherein each of the plurality of laser diodes is configured to provide a laser beam along a laser beam path at a laser beam power; wherein the laser beam path comprises an output propagation direction;
   b. a common external cavity shared by each of the plurality of laser diodes;
   c. a collimating optic in the output propagation direction laser beam paths for creating parallel beams from each of the plurality of laser diodes;
   d. a beam combination optic in the common external cavity and in the output propagation direction laser beam paths;
   e. wherein the beam combining optic comprises N−1 optical elements;
   f. wherein the optical elements comprises:
      i. a first means for determining the wavelength of a laser diode beam and directing the laser diode beam path in an output path;
      ii. a second means for determining the wavelength of a laser diode beam and directing the laser diode beam path in an output path;
      iii. wherein the output path for the first means is 90° with respect to the output path for the second means, thereby providing a combined output laser beam defining a brightness; and,
   g. the brightness of the sum of the individual laser diode beams after being combined by the first means and the second means is n times brighter than that of an individual laser diode beam; wherein n=N or n=N−1, N is the number of individual laser diode beams, E' is the number of first or the number of second means, and N/E' is the number of individual laser diode beams being combined by the first means or the second means as groups.

62. The system of claim 61, wherein the first means is a primary volume Bragg grating.

63. The system of claim 61, wherein the second means is a secondary volume Bragg grating.

64. The system of claim 62, wherein the second means is a secondary volume Bragg grating.

65. The system of claim 61, wherein the first means is a primary coating.

66. The system of claim 61, wherein the second means is a secondary coating.

67. The system of claim 65, wherein the second means is a secondary coating.

68. The system of claim 61 operating in the 400-500 nm range.

69. The system of claim 61 operating in the 500-600 nm range.

70. The system of claim 61 720-800 nm range.

71. The system of claim 61 operating in the 800-900 nm range.

* * * * *